United States Patent [19]

Kane

[11] Patent Number: 4,619,001

[45] Date of Patent: Oct. 21, 1986

[54] TUNING SYSTEMS ON DIELECTRIC SUBSTRATES

[75] Inventor: Johji Kane, Hirakata, Japan

[73] Assignee: Matsushita Electric Industrial Co., Ltd., Osaka, Japan

[21] Appl. No.: 636,666

[22] Filed: Aug. 1, 1984

[30] Foreign Application Priority Data

| Aug. 2, 1983 | [JP] | Japan | 58-141543 |
| Aug. 3, 1983 | [JP] | Japan | 58-143056 |
| Aug. 3, 1983 | [JP] | Japan | 58-143057 |
| Aug. 3, 1983 | [JP] | Japan | 58-143058 |
| Aug. 3, 1983 | [JP] | Japan | 58-143062 |
| Aug. 4, 1983 | [JP] | Japan | 58-143247 |
| Aug. 4, 1983 | [JP] | Japan | 58-143248 |
| Aug. 4, 1983 | [JP] | Japan | 58-143260 |

[51] Int. Cl.⁴ ............ H04B 1/26; H03F 3/191; H03B 5/18; H03J 3/00
[52] U.S. Cl. .................... 455/192; 455/196; 455/318; 455/326; 330/55; 330/56; 330/305; 330/306; 331/25; 331/99; 331/107 SL; 333/219; 333/235; 334/15; 334/41
[58] Field of Search ........... 333/202, 23, 204, 205, 333/219, 222, 223, 235; 334/15, 41, 45; 330/53, 55, 56, 305, 306; 331/99, 107 SL, 117 D, 25; 455/183, 192, 196, 197, 260, 318, 326, 341

[56] References Cited

U.S. PATENT DOCUMENTS

| 2,768,357 | 10/1956 | Lyons | 333/223 |
| 3,818,389 | 6/1974 | Fisher | 333/204 X |
| 4,121,182 | 10/1978 | Makimoto et al. | 334/45 X |
| 4,157,517 | 6/1979 | Kneisel et al. | 333/205 |
| 4,418,324 | 11/1983 | Higgins | 333/205 X |

Primary Examiner—Paul Gensler
Attorney, Agent, or Firm—Wenderoth, Lind & Ponack

[57] ABSTRACT

A tuning system employs a specific resonant circuit which includes two electrodes confronting each other through a dielectric interposed therebetween. Each of the two electrodes has at least one bent portion to present a lumped-constant inductance and has a desired equivalent electrical length. The two electrodes respectively have common terminals located out of mutually confronting positions so that voltage signals induced by mutual inductance between the electrodes will be opposite in phase so as to thereby produce a parasitic distributed-constant capacitance. The two electrodes form a two-terminal circuit network having a first terminal disposed at a desired position on one of the two electrodes and the common terminals as a second terminal. The first terminal of the resonant circuit is connected to a feedback amplifier, an amplifier, or a mixer so as to form a tuning oscillator, a tuning amplifier or a mixer.

49 Claims, 68 Drawing Figures

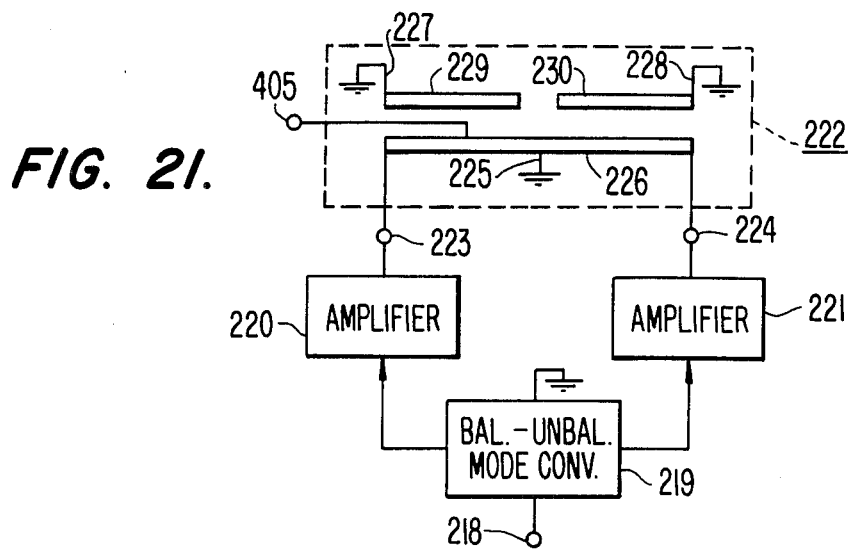

TUNING SYSTEMS ON DIELECTRIC SUBSTRATES

BACKGROUND OF THE INVENTION

1. Field of the Invention

The present invention relates to a tuning system for use in transmitters and receivers in radio, television, stereo tuners, and personal radio communications, and other communication equipment.

2. Description of the Prior Art

As more and more waves are used in radio and television broadcasting and communications, tuning systems for selecting the frequencies of waves to be received are required to be highly stable and reliable in their performance. There has also been a great demand for the reduction of the cost of manufacture of receivers, transmitters and other communication equipment in which the tuning systems are installed. In particular, the development of a new technology is desired for tuning system circuit components in radio-frequency stages which have been difficult to improve.

Conventional tuning systems will be described with reference to the drawings. FIG. 1 of the accompanying drawings shows a basic circuit arrangement of a tuning oscillator device. The tuning oscillator comprises a tuning circuit 4 composed of a tuning inductor 1, a variable capacitor 2, and a fixed capacitor 3. To the tuning circuit 4, there is connected an input terminal or output terminal 6 of a feedback amplifier 5.

FIG. 2 illustrates another circuit arrangement of a conventional tuning amplifier device, which comprises a tuning circuit 10 composed of a tuning inductor 7, a variable capacitor 8, and a fixed capacitor 9. A signal applied to an input terminal 11 is amplified by an amplifier 12 which supplies an amplified output through an output terminal 13 to the tuning circuit 10.

FIG. 3 shows a circuit arrangement of a conventional mixer device including a tuning circuit 16 comprising a tuning inductor 14 and a fixed capacitor 15. A mixer 19 has a first input terminal 17, a second input terminal 18, and an intermediate-frequency output terminal 20 connected to the tuning circuit 16.

FIG. 4 shows conventional components of which the tuning circuits 4, 10, 16 shown in FIGS. 1 through 3 are composed. The components include a tuning inductor 21, a variable capacitor 22, and a fixed capacitor 23 which are interconnected by circuit conductors 24, 25.

However, the conventional arrangements have been subjected to the following disadvantages:

In the tuning system shown in FIG. 4, the inductor component 21 is large in size as compared with the other components, and is particularly much larger in height, with the result that the equipment in which the tuning system is incorporated is not rendered small in size and low in profile. A ferrite core inserted in the inductor component is variable in position due to mechanical vibrations, resulting in wide variations in tuning frequencies. The inductance of the inductor component is unstable due to a large degree of temperature-dependency of the magnetic permeability of the ferrite core, a feature which also causes tuning frequencies and also Q of the resonator filter circuit to vary widely. For keeping tuning frequencies stably at their target settings, the components are required to be installed highly accurately in predetermined positions. Where the tuning systems are mass-produced as RF resonator filters, it is difficult to maintain a desired installation accuracy and hence the tuning frequencies tend to differ largely from their target settings and cannot be caused to converge to fixed values. Therefore, there has been difficulty experienced with the mass production of the tuning systems.

The tuning system arrangement shown in FIG. 4 has other drawbacks. The inductor and the capacitor are constructed as separate components that are interconnected by long conductors. The long conductors tend to produce unwanted lead inductances and stray capacitances which cause the tuning circuit to operate unstably and make it difficult to achieve an initial design target. Accordingly, no sufficient frequency selectivity can be ensured, and undesired resonant conditions are produced at uncertain frequencies, with the consequence that no tuning systems of desired design can be achieved. This invites abnormal oscillation, oscillation of unwanted signals, increased higher harmonics in oscillated signals, resulting increased distortion, and a narrowed width in which a variable tuning oscillation frequency varies. Furthermore, no sufficient frequency selectivity can be ensured, and undesired resonant conditions are produced at uncertain frequencies, with the consequence that no tuning amplifiers of desired design can be achieved. This invites abnormal oscillation, response of unwanted signals, increased higher harmonics in amplified signals, resulting increased distortion, a narrowed width in which a variable tuning oscillation frequency varies, and deterioration in abilities to remove intermodulation interference and spurious interference. Also, no sufficient frequency selectivity can be ensured, and undesired resonant conditions are produced at uncertain frequencies, with the consequence that no intermediate-frequency tuning circuits of desired design can be achieved. This invites abnormal oscillation, generation of spurious signals, increased distortion caused by increased higher harmonics in intermediate-frequency signals, and deterioration in abilities to remove intermodulation interference and spurious interference.

Since the tuning circuits are composed of discrete components having minimum unit functions, there is a limitation on efforts to reduce the number of parts used and to improve the manufacturing process.

SUMMARY OF THE INVENTION

It is an object of the present invention to provide a tuning oscillator having a tuning circuit which is composed of an integral construction of inductor and capacitor components, the tuning system being low in profile, small in size, stable and highly accurate in oscillating and tuning operation against variations in ambient conditions such as mechanical vibrations and temperature variations, and stable in oscillating and tuning operation at high frequencies without suffering from adverse influences by connector leads in the tuning circuit.

Another object of the present invention is to provide a tuning amplifier having a tuning circuit which is composed of an integral construction of inductor and capacitor components, the tuning amplifier being low in profile, small in size, stable and highly accurate in amplifying and tuning operation against variations in ambient conditions such as mechanical vibrations and temperature variations, and stable amplifying and tuning operation at high frequencies without suffering from adverse influences by connector leads in the tuning circuit.

Still another object of the present invention to provide a mixer device having a tuning circuit which is composed of an integral construction of inductor and capacitor components, the mixing device being low in profile, small in size, stable and highly accurate in mixing operation against variations in ambient conditions such as mechanical vibrations and temperature variations, highly accurate at an inermediate frequency, and stable in mixing operation at high frequencies without suffering from adverse influences by connector leads in the tuning circuit.

A still further object of the present invention is to provide a tuning system having a tuning circuit which is composed of a low-profile integral construction of variable inductor and capacitor components, the tuning system being low in profile, small in size, stable in tuning against mechanical vibrations, having a tuning frequency less dependent on temperatures, being stable in a high-frequency range without suffering from adverse influences of connector leads in the tuning circuit, and having a reduced number of components so that the tuning system can be manufactured by an improved process, the tuning system being capable of trimming a tuning frequency through a simple adjustment procedure and improving the stability of the trimmed tuning frequency.

To achieve the above objects, a tuning system of the present invention includes first and second electrodes confronting each other with a dielectric interposed therebetween, each of the first and second electrodes having at least one bent portion to present primarily a lumped-constant inductance and having a desired equivalent electrical length, the first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric, one of the first and second electrodes having a first terminal at a desired position thereof, the electrodes forming a two-terminal circuit network having the first terminal with the ground or common terminals serving as a second terminal, the two-terminal circuit network forming an equivalent parallel resonant circuit composed of a lumped-constant inductance formed by said one electrode and a parasitic distributed-constant capacitance between the first and second electrodes. The resonant circuit is connected to a feedback amplifier as a load thereof or a preamplifier thereof to provide a tuning oscillator function. The resonant circuit is connected to an amplifier as a load thereof or a preamplifier thereof to provide a tuning amplifier function. The resonant circuit is connected to a mixer as a load thereof or a preamplifier thereof to provide a mixer function. One or a plurality of such resonant circuits are provided, and the tuning frequency of the each resonant circuit is trimmed by cutting off the electrodes of each resonant circuit or connecting ground terminals to the electrodes. The above functional circuits are connected directly or through other circuit components.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 19 through 22 are circuit diagrams of balanced tuning amplifier devices according to embodiments of the present invention;

FIGS. 23 through 27 are circuit diagrams of balanced mixer devices according to embodiments of the present invention;

DESCRIPTION OF THE PREFERRED EMBODIMENTS

Figure 1:
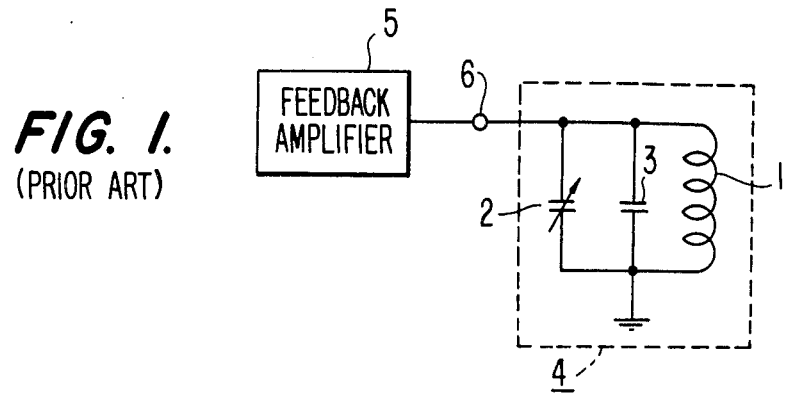
FIG. 1 is a circuit diagram of a conventional tuning oscillator device.
Figure 2:
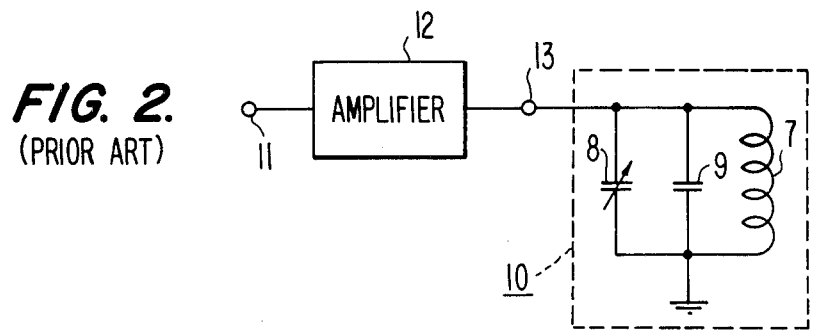
FIG. 2 is a circuit diagram of a conventional tuning amplifier device.
Figure 3:
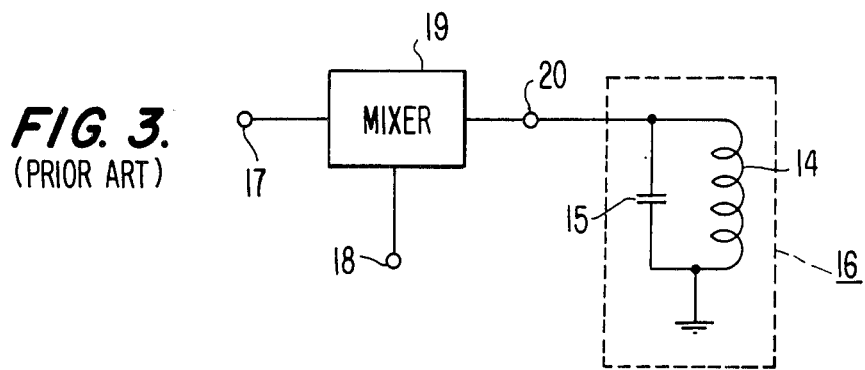
FIG. 3 is a circuit diagram of a conventional mixer device.
Figure 4:
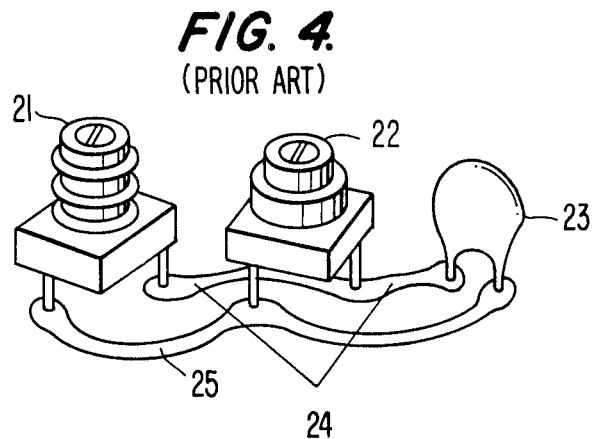
FIG. 4 is a perspective view of the components of a tuning circuit of a conventional tuning system.
Figure 5:
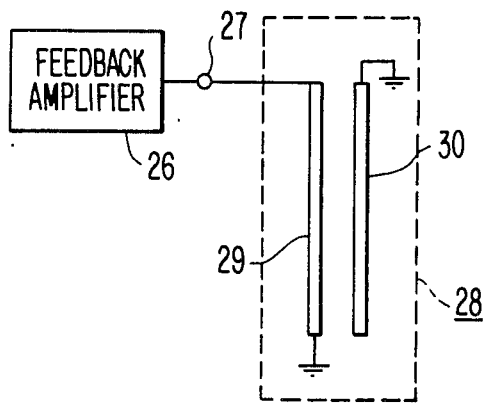
FIGS. 5 and 6 are circuit diagrams of tuning oscillator devices according to embodiments of the present invention.

FIG. 5 shows a tuning oscillator device according to an embodiment of the present invention. A feedback amplifier 27 has an input or output terminal 27 connected to a tuning circuit 28. The tuning circuit 28 includes a transmission-like electrode 29 having an inductance composed of a distributed inductance and a lumped inductance produced by bending the transmission line. The tuning circuit 28 also includes a transmission-line electrode 30 disposed in a confronting or juxtaposed relationship to the transmission-line electrode 29 with a dielectric (not shown) interposed therebetween or on a surface of the dielectric. The transmission-line electrodes 29 and 30 jointly constitute a transmission line for producing a negative reactance. The transmission-line electrodes 29 and 30 have ground terminals disposed at opposite ends. The tuning circuit 28 has an input terminal 27 (which is the same as the input or output terminal 27 of the feedback amplifier 26) that is connected to an open terminal of the transmission-line electrode 29.

Figure 6:
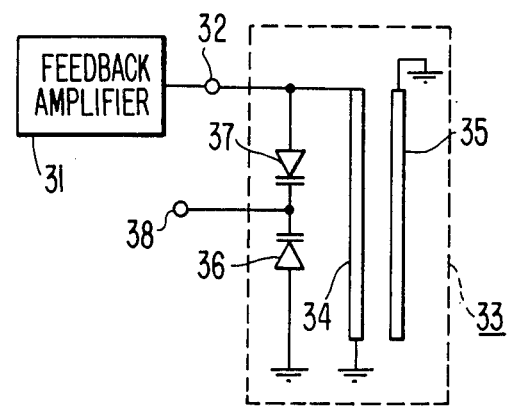

FIG. 6 illustrates a tuning oscillator device according to another embodiment of the present invention. A feedback amplifier 31 has an input or output terminal 32 connected to a tuning circuit 33. The tuning circuit 33 includes a transmission-line electrode 34 having an inductance composed of a distributed inductance and a lumped inductance produced by bending the transmission line. The tuning circuit 33 also includes a transmission-line electrode 35 disposed in a confronting or juxtaposed relationship to the transmission-line electrode 34 with a dielectric (not shown) interposed therebetween or on a surface of the dielectric. The transmission-line electrodes 34 and 35 jointly constitute a transmission line for producing a negative reactance. The transmission-line electrodes 34 and 35 have ground terminals disposed at opposite ends. The tuning circuit 33 has an input terminal 32 (which is the same as the input or output terminal 32 of the feedback amplifier 21) that is coupled to an open terminal of the transmission-line electrode 34. To the input terminal 32 connected to the open terminal of the transmission-line electrode 34, there are connected voltage-variable capacitance diodes 36 and 37 used as variable reactance elements. Designated at 38 is a control voltage input terminal for the voltage-variable capacitance diodes 36 and 37.

In the embodiments shown in FIGS. 5 and 6, the terminals of the tuning circuits 28 and 33 which are shown as ground terminals may not be connected to ground, but may serve as common terminals in the tuning circuits 28 and 33, which may be connected to the other circuits including the respective feedback amplifiers. Furthermore, the input terminals 27 and 32 in the tuning circuits 28 and 33 are not limited in position to the ends of the transmission-line electrodes 29 and 34, but may be coupled to desired positions thereon which have desired impedances. The voltage-variable capacitance diodes 36 and 37 may not be connected to the prescribed position on the transmission-line electrode 34, but may be connected to a desired position on the transmission-line electrode 34.

Where it is necessary to adjust the tuning frequencies of the tuning circuits 23 and 33 in the embodiments of FIGS. 5 and 6, the transmission-line electrodes 30 and 35 may be cut off at desired positions, or the ground terminals of the transmission-line electrodes 29, 30, 34, 35 may be connected to desired positions thereby to change the distributed capacitance and inductance.

The arrangement shown in FIG. 5 can provide a tuning oscillator device of a simple construction having a single oscillation frequency, and the arrangement of FIG. 6 can provide a tuning oscillator device capable of varying an oscillation frequency as desired.

The feedback amplifiers in the above tuning oscillator devices may be constructed of semiconductor devices such as transistors, field-effect transistors, or ICs, or vacuum tubes.

As described above, the tuning circuit comprises electrodes disposed in a confronting relationship with a thin dielectric interposed therebetween or in juxtaposed relation on a surface of a dielectric, the tuning circuit being connected to an input or output terminal of a feedback amplifier. Therefore, the tuning circuit has the following advantages:

(1) A tuning circuit for use in a tuning oscillator device can provide a resonant circuit without any connector lead between an inductor and a capacitor, and can perform a tuning function. This arrangement eliminates a lead inductance and a stray capacitance which would be generated in the tuning circuit. Accordingly, no unexpected resonance other than resonance at a target tuning frequency will be present in a wide frequency range. As a result, stable frequency selectivity characteristics can be ensured to sufficiently increase the level of a fundamental of a signal to be oscillated and reduce the levels of harmonics. Any distortion of the oscillated signal can therefore be greatly stabilized and reduced. The stable frequency selectivity characteristics can sufficiently solve the problem of emitting a spurious interference signal.

(2) Since a tuning oscillator device has a tuning circuit which can be fabricated as a module, the constants of the inductance and capacitance of the tuning circuit are prevented from being varied due to mechanical vibrations, with the result that oscillation tuning characteristics are highly stable. By constructing the dielectric in the tuning circuit of a material having a dielectric constant less dependent on temperature, any variations in the capacitance due to changes in ambient temperature can greatly be reduced, thus making tuning characteristics highly stable. Consequently, the oscillation frequency characteristics and unwanted-interference-signal elimination characteristics of the tuning oscillator device are not dependent on variations in ambient conditions, remain stable not only during an initial period, but over a prolonged period of time.

(3) The tuning oscillator device has a tuning circuit of a simple unitary construction and is of a highly simple arrangement. Thus, there can be achieved a tuning oscillator device which is extremely low in profile and small in size, with the result that the amount of unwanted radiation of an oscillated signal from the tuning circuit can be minimized. This makes the oscillation of the tuning oscillator device stable and prevents the tuning oscillator device from interfering with other oscillator systems.

(4) By using the dielectric in the tuning circuit as a circuit board or substrate for the tuning oscillator device, the mounting arrangement of the tuning oscillator device is improved, and the number of components constituting the tuning circuit is greatly reduced. The tuning oscillator device therefore lends itself to mass production and can be fabricated at a reduced cost.

Figure 7:
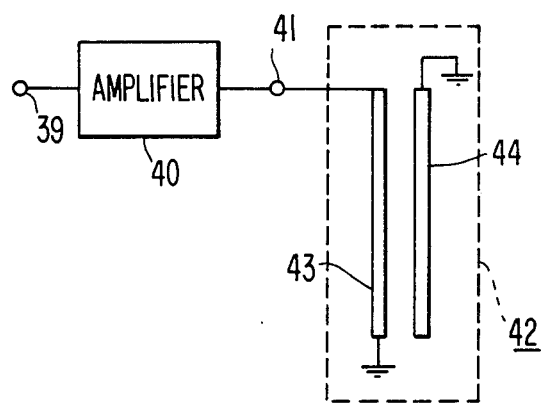
FIGS. 7 through 9 are circuit diagrams of tuning amplifier devices according to embodiments of the present invention.

FIG. 7 shows a tuning amplifier device according to an embodiment of the present invention. A signal applied to an input terminal 39 is amplified by an amplifier 40, and an amplified output signal therefrom is supplied through an output terminal 41 to an input terminal 41 (which is the same as the output terminal 41 of the amplifier 40) of a tuning circuit 42. The tuning circuit 42 includes a transmission-line electrode 43 having an inductance composed of a distributed inductance and a lumped inductance produced by bending the transmission line. The tuning circuit 42 also includes a transmission-line electrode 44 disposed in a confronting or juxtaposed relationship to the transmission-line electrode 43 with a dielectric (not shown) interposed therebetween or on a surface of the dielectric. The transmission-line electrodes 43 and 44 jointly constitute a transmission line for producing a negative reactance. The transmission-line electrodes 43 and 44 have ground terminals disposed at opposite ends.

Figure 8:
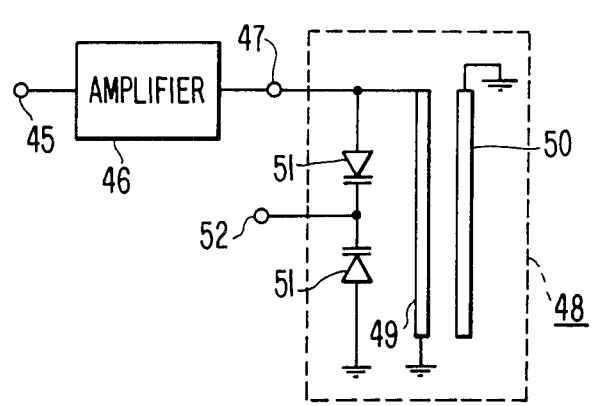

FIG. 8 shows a tuning amplifier device according to another embodiment of the present invention. A signal applied to an input terminal 45 is amplified by an amplifier 46, and an amplified output signal therefrom is supplied through an output terminal 47 to an input terminal 47 (which is the same as the output terminal 47 of the amplifier 46) of a tuning circuit 48. The tuning circuit 48 includes a transmission-line electrode 49 having an inductance composed of a distributed inductance and a lumped inductance produced by bending the transmission line. The tuning circuit 48 also includes a transmission-line electrode 50 disposed in a confronting or juxtaposed relationship to the transmission-line electrode 49 with a dielectric (not shown) interposed therebetween or on a surface of the dielectric. The transmission-line electrodes 49 and 50 jointly constitute a transmission line for producing a negative reactance. The transmission-line electrodes 49 and 50 have ground terminals disposed at opposite ends. To the input terminal 47 which is coupled to an open terminal of the transmission-line electrode 49, there are connected voltage-variable capacitance diodes 51 used as variable reactance elements. Designated at 52 is a control voltage input terminal for the voltage-variable capacitance diodes 51.

Figure 9:
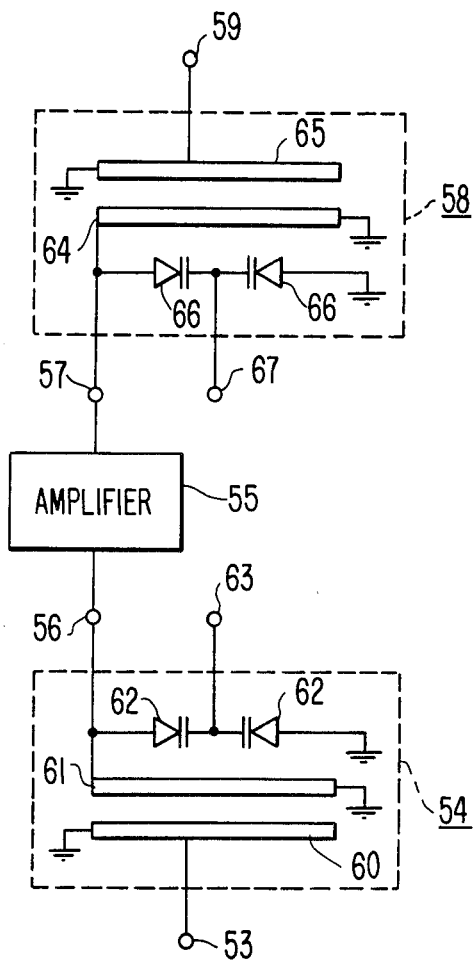

FIG. 9 illustrates a tuning amplifier device according to still another embodiment of the present invention. A signal applied to an input terminal 53 is tuned and selected by an input tuning circuit 54 and supplied to an input terminal 56 of an amplifier 55. An amplified output signal from the amplifier 55 is delivered through an output terminal 57 to an output tuning circuit 58, by which the signal is tuned and selected and fed to an output terminal 59. The input tuning circuit 54 has transmission-line electrodes 60 and 61, and voltage-variable capacitance diodes 62, and a control voltage input terminal 63, and the output tuning circuit 58 has transmission-line electrodes 64 and 65 and voltage-variable capacitance diodes 66, and a control voltage input terminal 67. The input and output tuning circuits 54 and 58 are of the same construction as that of the tuning circuit 48 described with reference to FIG. 8. The input terminal 53 and the output terminal 59 are connected to desired positions on the transmission-line electrodes 60 and 65 which have required impedances.

In the embodiments shown in FIGS. 7 through 9, the terminals of the tuning circuits 42, 48, 54, 58 which are shown as ground terminals may not be connected to ground, but may serve as common terminals in the tuning circuits 42, 48, 54, 58, which may be connected to the other circuits including the respective amplifiers 40, 46, 55. Furthermore, the input terminals 41, 47, 57, and the output terminal 56 in the tuning circuits 42, 48, 54, 58 are not limited in position to the ends of the transmission-line electrodes 43, 49, 61, 64, but may be coupled to desired positions thereon which have desired impedances. The voltage-variable capacitance diodes 51, 62 and 66 may not be connected to the prescribed positions on the transmission-line electrodes 43, 49, 61, 64, but may be connected to a desired positions on the transmission-line electrodes 44, 50, 60, 65.

Where it is necessary to adjust the tuning frequencies of the tuning circuits 42, 48, 54, 58 in the embodiments of FIGS. 7 through 9, the transmission-line electrodes 44, 50, 60, 65 may be cut off at desired positions, or the ground terminals of the transmission-line electrodes 43, 44, 49, 50, 60, 61, 64, 65 may be connected to desired positions so as to thereby change the distributed capacitance and inductance.

The arrangement shown in FIG. 7 can provide a tuning amplifier device of a simple construction having a single tuning frequency, the arrangement of FIG. 8 can provide a tuning amplifier device capable of varying a tuning frequency as desired, and the arrangement of FIG. 9 can provide a tuning amplifier device having high frequency selectivity characteristics and capable of varying a tuning frequency as desired.

The amplifiers in the above tuning amplifier devices may be constructed of semiconductor devices such as transistors, field-effect transistors, or ICs, or vacuum tubes.

As described above, the tuning circuit comprises electrodes disposed in a confronting relationship with a thin dielectric interposed therebetween or in a juxtaposed relationship on a surface of a dielectric, the tuning circuit being connected to an input and/or output terminal of an amplifier. Therefore, the tuning circuit has the following advantages:

(1) A tuning circuit for use in a tuning amplifier device can provide a resonant circuit without any connector lead between an inductor and a capacitor, and can perform a tuning function. This arrangement eliminates a lead inductance and a stray capacitance which would be generated in the tuning circuit. Accordingly, no unexpected resonance other than resonance at a target tuning frequency will be present in a wide frequency range. As a result, stable frequency selectivity characteristics can be ensured to sufficiently increase the level of a fundamental of a signal to be amplified and reduce the levels of harmonics. Any distortion of the amplified signal can therefore be greatly stabilized and reduced. The stable frequency selectivity characteristics can sufficiently reduce the problem of intermodulation interference and spurious interference which would be produced in simultaneously amplifying a number of signals.

(2) Since a tuning amplifier device has a tuning circuit which can be fabricated as a module, the constants of the inductance and capacitance of the tuning circuit are prevented from being varied due to mechanical vibrations, with the result that the amplification tuning characteristics are highly stable. By constructing the dielectric in the tuning circuit of a material having a dielectric constant less dependent on temperature, any variations in the capacitance due to changes in ambient temperature can greatly be reduced, thus making tuning characteristics highly stable. Consequently, the amplification gain characteristics and unwanted-interference-signal elimination characteristics of the tuning amplifier device are not dependent on variations in ambient conditions, but remain stable not only during an initial period, but over a prolonged period of time.

(3) The tuning amplifier device has a tuning circuit of a simple unitary construction and is of a highly simple arrangement. Thus, there can be achieved a tuning amplifier device which is extremely low in profile and small in size, with the result that the amount of unwanted radiation of an amplifier signal from the tuning circuit can be minimized. This makes the amplification of the tuning amplifier device stable and prevents the tuning amplifier device from interfering with other amplifier systems.

(4) By using the dielectric in the tuning circuit as a circuit board or substrate for the tuning amplifier device, the mounting arrangement of the tuning amplifier device is improved, and the number of components constituting the tuning circuit is greatly reduced. The tuning amplifier device therefore lends itself to mass production and can be fabricated at a reduced cost.

Figure 10:
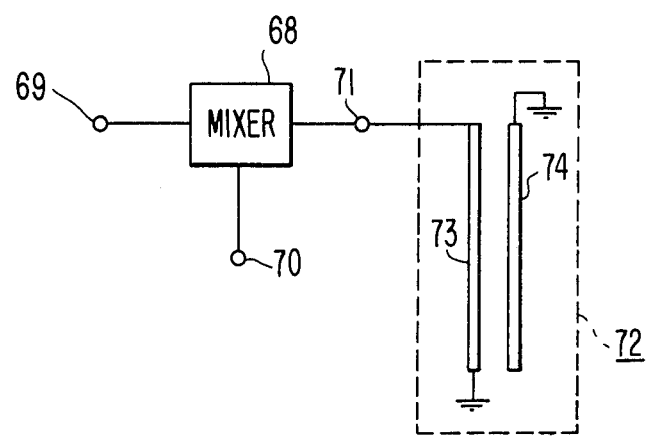
FIGS. 10 and 11 are circuit diagrams of mixer devices according to embodiments of the present invention.

FIG. 10 shows a mixer device according to an embodiment of the present invention. A mixer 68 serves to mix input signals applied to input terminals 69 and 70 and outputs an intermediate-frequency output signal to an output terminal 71 connected to a tuning circuit 72. The tuning circuit 72 includes a transmission-line electrode 73 having an inductance composed of a distributed inductance and a lumped inductance produced by bending the transmission line. The tuning circuit 72 also includes a transmission-line electrode 74 disposed in a confronting or juxtaposed relationship to the transmission-line electrode 73 with a dielectric (not shown) interposed therebetween or on a surface of the dielectric. The transmission-line electrodes 73 and 74 have ground terminals disposed at opposite ends. The tuning circuit 72 has an input terminal 71 (which is the same as the output terminal 71 of the mixer 68) that is connected to an open terminal of the transmission-line electrode 73.

Figure 11:
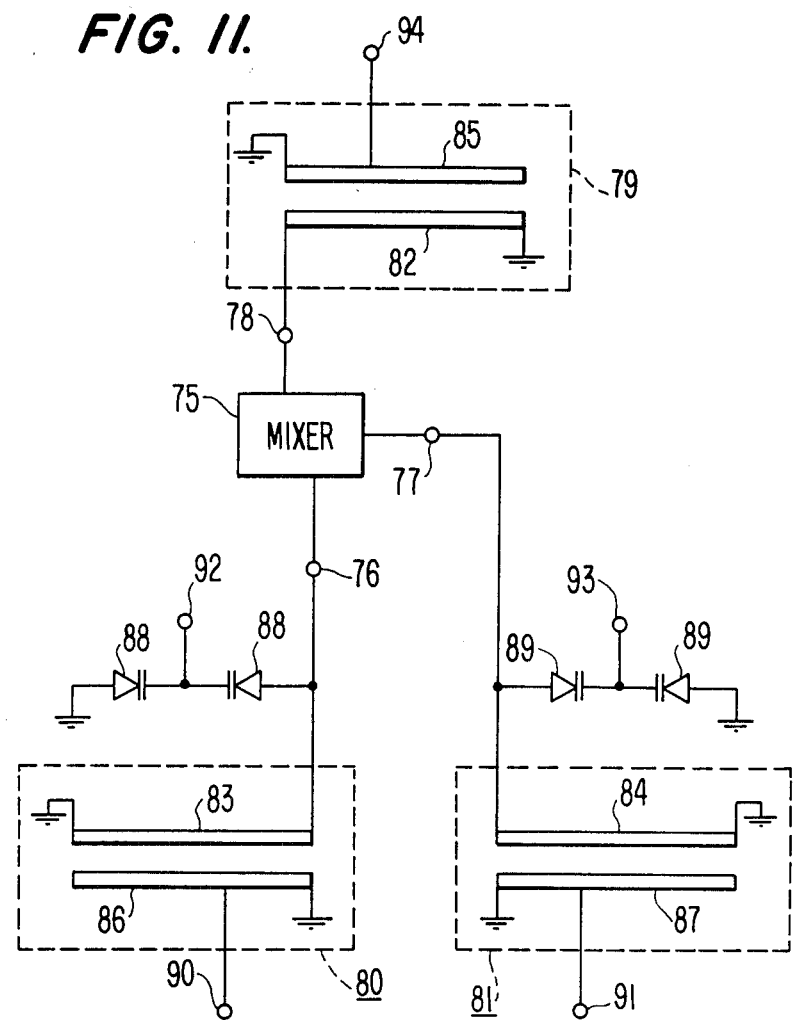

FIG. 11 shows a mixer device according to another embodiment of the present invention. A mixer 75 serves to mix input signals applied to input terminals 76 and 77 and outputs an intermediate-frequency output signal to an output terminal 78 connected to a tuning circuit 79. The input terminals 76 and 77 are connected respectively to the tuning circuits 80 and 81. The tuning circuits 79, 80, 81 include transmission-line electrodes 82, 83, 84 each having an inductance composed of a distributed inductance and a lumped inductance produced by bending the transmission line. The tuning circuits 79, 80, 81 also include transmission-line electrodes 85, 86, 87 disposed in a confronting or juxtaposed relationship to the transmission-line electrodes 82, 83, 84 with dielectrics (not shown) interposed therebetween or on surfaces of the dielectrics. The transmision-line electrodes 82 and 85, 83 and 86; and 84 and 87 have ground terminals disposed at opposite ends. The tuning circuit 79 has an input terminal 78 (which is the same as the output terminal 78 of the mixer 75) that is connected to an open terminal of the transmission-line electrode 82. The input terminals 76 and 77 of the mixer 75 (which are the same as the output terminals 76 and 77 of the tuning circuits 80 and 81) are connected to open terminals of the transmission-line electrodes 83 and 84. To the tuning circuits 80 and 81, there are connected pairs of voltage-variable capacitance diodes 88 and 89, respectively. Thus, variable tuning circuits are connected respectively to the input terminals 76 and 77 of the mixer 75. More specifically, where an amplifier is connected to an input terminal 90 coupled to the transmission-line electrode 86 in the tuning circuit 80, there is provided as a pre-stage a variable selecting and amplifying function, and where a feedback amplifier is connected to an input terminal 91 coupled to the transmission-line electrode 87 in the tuning circuit 81, there is provided as a pre-stage a variable oscillating function. Variable control in the variable selecting and amplifying function and the variable oscillating function is dependent on control voltages applied to control terminals 92 and 83 of the voltage-variable capacitance diodes 88 and 89. The input signals applied to the input terminals 76 and 77 are mixed by the mixer 75, and the intermediate-frequency signal produced by mixing the input signals is supplied to a selective load circuit formed by the tuning circuit 79 and output from an output terminal 94 coupled to the transmission-line electrode 85.

In the embodiments shown in FIGS. 10 and 11, the terminals of the tuning circuits 72, 79, 80, 81 which are shown as ground terminals may not be connected to ground, but may serve as common terminals in the tuning circuits 72, 79, 80, 81, which may be connected to the other circuits including the respective mixers. Furthermore, the input terminals 71, 78 and the output terminals 76, 77 in the tuning curcuits 72, 79, 80, 81 are not limited in position to the ends of the transmission-line electrodes 73, 82, 83, 84, but may be coupled to desired positions thereon which have desired impedances. The voltage-variable capacitance diodes 83 and 84 may not be connected to the prescribed positions on the transmission-line electrodes 83 and 84, but may be connected to a desired positions on the transmission-line electrodes 83 and 84.

Where it is necessary to adjust the tuning frequencies of the tuning circuits 72, 79, 80, 81 in the embodiments of FIGS. 10 and 11, the transmission-line electrodes 74, 85, 86, 87 may be cut off at desired positions, or the ground terminals of the transmission-line electrodes 73, 74, 82, 85, 83, 86, 84, 87 may be connected to desired positions thereby to change the distributed capacitance and inductance.

The mixers in the above mixer devices may be constructed of semiconductor devices such as transistors, field-effect transistors, or ICs, or vacuum tubes.

As described above, the tuning circuit comprises electrodes disposed in a confronting relationship with a thin dielectric interposed therebetween or in a juxtaposed relationship on a surface of a dielectric, the tuning circuit being connected to an input and/or output terminal of an amplifier. Therefore, the tuning circuit has the following advantages:

(1) A tuning circuit for use in a mixer device can provide a resonant circuit without any connector lead between an inductor and a capacitor, and can perform a tuning function. This arrangement eliminates a lead inductance and a stray capacitance which would be generated in the tuning circuit. Accordingly, no unexpected resonance other than resonance at a target tuning frequency will be present in a wide frequency range. As a result, stable frequency selectivity characteristics can be ensured to sufficiently increase the levels of fundamentals of signals to be mixed and reduce the levels of harmonics. Any distortion of the mixed signal can therefore be greatly stabilized and reduced. The stable frequency selectivity characteristics can sufficiently reduce the problem of intermodulation interference and spurious interference which would be produced in simultaneously mixing a number of signals.

(2) Since a mixer device has a tuning circuit which can be fabricated as a module, the constants of the inductance and capacitance of the tuning circuit are prevented from being varied due to mechanical vibrations, with the result that mixing tuning characteristics are highly stable. By constructing the dielectric in the tuning circuit of a material having a dielectric constant less dependent on temperature, any variations in the capacitance due to changes in ambient temperature can greatly be reduced, thus making tuning characteristics highly stable. Consequently, the conversion gain characteristics and unwanted-interference-signal elimination characteristics of the mixer device are not dependent on variations in ambient conditions, but remain stable not only during an initial period, but over a prolonged period of time.

(3) The mixer device has a tuning circuit of a simple unitary construction and is of a highly simple arrangement. Thus, there can be achieved a mixer device which is extremely low in profile and small in size, with the result that the amount of unwanted radiation of an amplified signal from the tuning circuit can be minimized. This makes the mixing operation of the mixer device stable and prevents the mixer device from interfering with other mixer systems.

(4) By using the dielectric in the tuning circuit as a circuit board or substrate for the mixer device, the mounting arrangement of the mixer device is improved, and the number of components constituting the tuning circuit is greatly reduced. The mixer device therefore lends itself to mass production and can be fabricated at a reduced cost.

Figure 12:
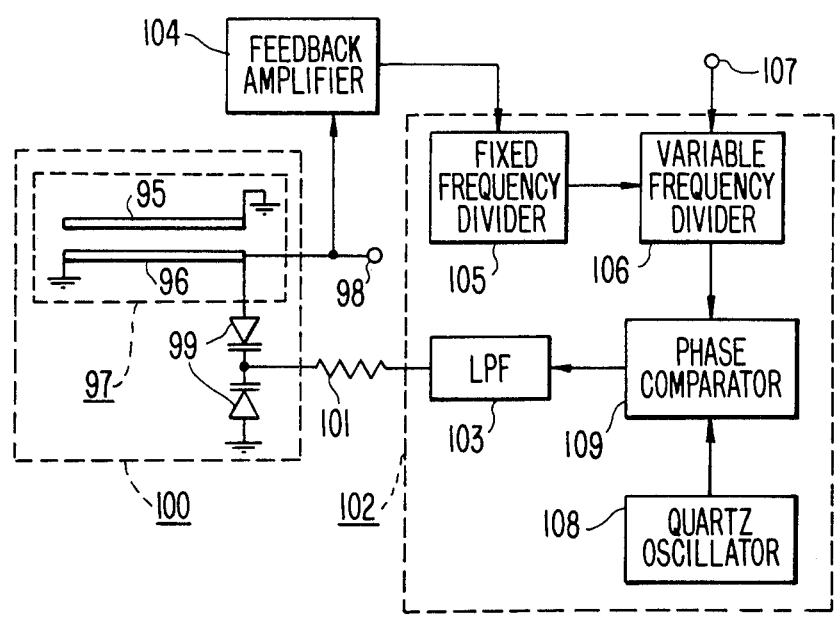
FIGS. 12 through 14 are block diagrams of tuning oscillator devices of a PLL synthesizer control system according to embodiments of the present invention.

FIG. 12 illustrates a tuning oscillator device according to an embodiment of the present invention. A tuning circuit 100 comprises a transmission-line electrode 95 having a distributed inductance, and a transmission-line electrode 96 disposed in a confronting relationship to the transmission-line electrode 95 with a dielectric (not shown) interposed therebetween, the transmission-line electrode 96 having a distributed capacitance. The transmission-line electrodes 95 and 96 have ground terminals disposed at opposite ends, and jointly form a parallel-connected circuit 97 of an inductor and a capacitor. To an open terminal 98 of the transmission-line electrode 96, there is connected a pair of voltage-variable capacitance diodes 99 to which is applied an output voltage from a low-pass filter 103 in a PLL circuit 102 through a AC-signal blocking resistor 101. The open terminal 98 of the transmission-line electrode 96 is connected to a feedback amplifier 104, thus constituting an oscillator circuit. A portion of an oscillated signal output from the feedback amplifier 104 is supplied to a fixed frequency divider 105 and frequency-divided thereby. A frequency-divided output from the fixed frequency divider 105 is supplied to a variable frequency divider 106 in which it is frequency-divided into a variable frequency according to a digital code supplied to an input terminal 107 for a digital tuning control signal. A frequency-divided output from the variable frequency divider 106 is compared in phase with an oscillator output from a quartz oscillator 108 by a phase comparator 109, which supplies a phase detection signal to the low-pass filter 103.

Figure 13:
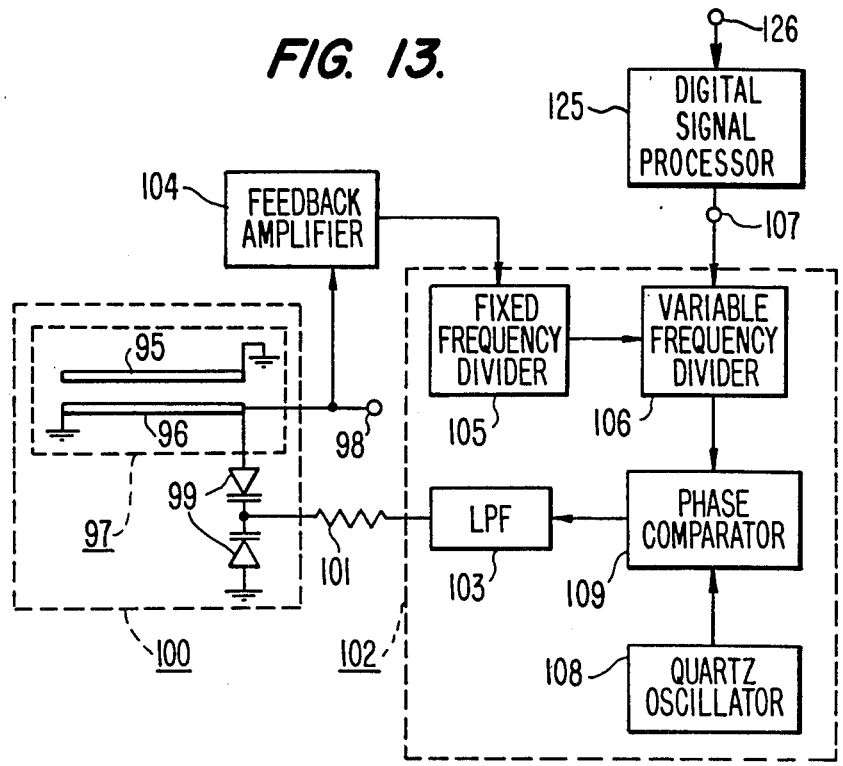

FIG. 13 shows a tuning oscillator device according to another embodiment of the present invention. Most of the system shown in FIG. 13 is the same as that of the system shown in FIG. 12. To the input terminal 107 of the PLL circuit 102, there is supplied an output from a digital signal processor 125 composed of a latch, or RAM or ROM and serving to store a tuning control digital signal code applied to an input terminal 126 or to convert such a signal into another digital signal code.

Figure 14:
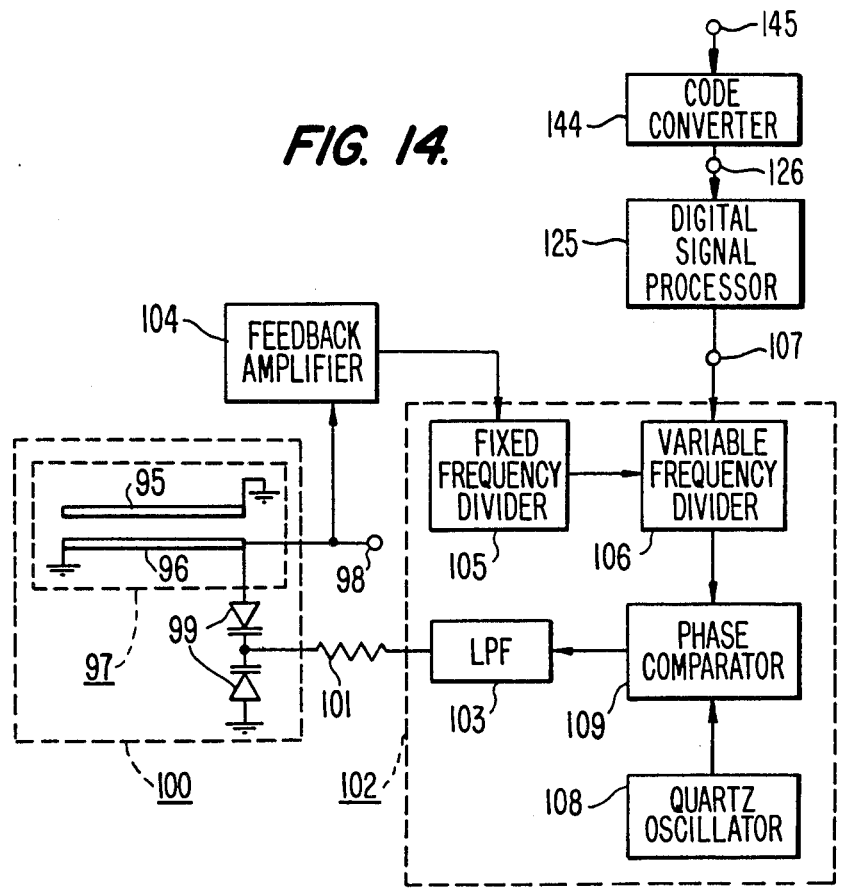

FIG. 14 is illustrative of a tuning oscillator device according to still another embodiment of the present invention. Most of the system shown in FIG. 14 is the same as that of the system shown in FIG. 13. The input terminal 126 of the digital signal processor 125 is supplied with an output from a code converter 144 which serves to convert a tuning control serial digital signal code supplied from an input terminal 145 into a parallel digital signal code.

As described above, the tuning circuit comprises confronting electrodes with a dielectric interposed therebetween, and a control voltage for a voltage-variable reactance element is varied by a digital signal code. The tuning oscillator device has the following advantages:

(1) Inductor and capacitor components of the tuning circuit can be of a simple unitary construction.

(2) The tuning circuit is of a low profile and a small size.

(3) Since the inductor and capacitor of the tuning circuit are connected without a lead, the tuning circuit is not subjected to any lead inductance and stray capacitance, and hence the operation of the tuning oscillator device is highly stabilized and the tuning accuracy is improved.

(4) It is possible to reduce the number of parts of the tuning circuit, so that the manufacturing process can be improved and the cost of manufacture can be lowered.

(5) A highly stable tuning control voltage can be generated by tuning a control system using a digital signal code and a stable frequency locking capability of the PLL circuit. Therefore, the tuning accuracy of the tuning oscillator device can be largely increased.

(6) The tuning oscillator device can be connected to a multiple-function digital control system controlled by a computer. The tuning oscillator device and any device employing the same can be controlled for sophisticated multiple functions.

Figure 15:
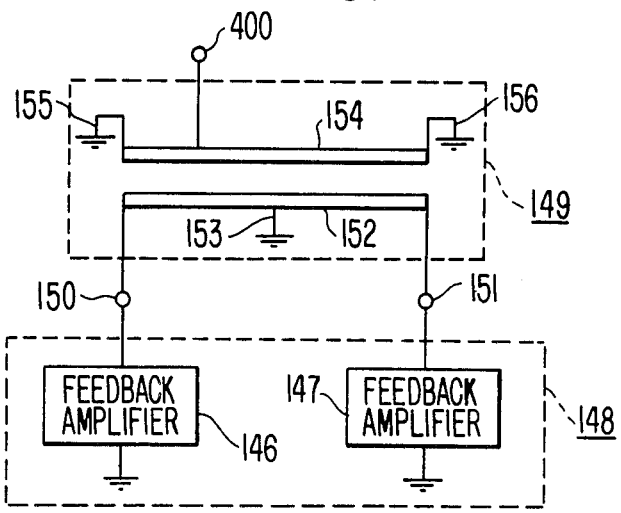
FIGS. 15 through 18 are circuit diagrams of balanced tuning oscillator devices according to embodiments of the present invention.

FIG. 15 shows a balanced tuning oscillator device according to an embodiment of the present invention. A balanced feedback amplifier composed of feedback amplifiers 146 and 147 has input or output terminals connected to balanced terminals 150 and 151 of a balanced tuning circuit 149. The feedback amplifiers 146 and 147 are capable of positive-feedback amplification in a mode in which they operate in mutually opposite phases. The balanced tuning circuit 149 has a main electrode 152 having a neutral ground terminal 153 and providing a distributed inductance, the main electrode 152 having balanced terminals 150 and 151. An auxiliary electrode 154 is disposed in a confronting relationship to the main electrode 152 with a dielectric (not shown) interposed therebetween, and has opposite ends serving as ground terminals 155 and 156. A hypothetical neutral point may be produced without providing the ground terminal 153 of the main electrode 152, so that an equivalent ground terminal can be achieved. The balanced terminals 150 and 151 may be connected to any positions on the main electrode 152 which present desired impedances, rather than at the ends of the main electrode 152. The ground terminals 155 and 156 of the auxiliary electrode 154 may also be connected to desired positions on the auxiliary electrode 154. An output signal of the balanced tuning oscillator can be obtained at an unbalanced output tap terminal 400 disposed at any position on the auxiliary electrode 154. According to the embodiment of FIG. 15, the balanced tuning circuit can be constructed simply of single main and auxiliary electrodes.

Figure 16:
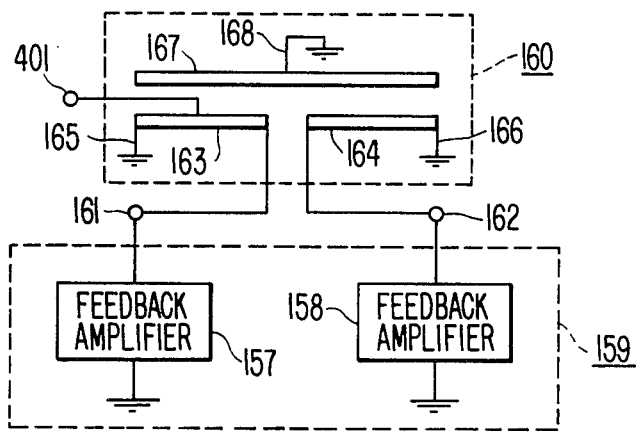

FIG. 16 illustrates a balanced tuning oscillator device according to another embodiment of the present invention. A balanced feedback amplifier 159 composed of feedback amplifiers 157 and 158 has input or output terminals connected to balanced terminals 161 and 162 of a balanced tuning circuit 160. The feedback amplifiers 157 and 158 are capable of positive-feedback amplification in a mode in which they operate in mutually opposite phases. The balanced tuning circuit 160 has main electrodes 163 and 164 having neutral ground terminals 165 and 166 and balanced terminals 161 and 162. An auxiliary electrode 167 is disposed in a confronting relationship to the main electrode 163 with a dielectric (not shown) interposed therebetween, and has a ground terminal 168 positioned in substantially confronting relationship to the balanced terminals 161 and 162. The balanced terminals 161 and 162 may be connected to any positions on the main electrodes 163 and 164 which present desired impedances, rather than at the ends of the main electrodes 163 and 164. An output signal of the balanced tuning oscillator can be obtained at an unbalanced output tap terminal 401 disposed at any position of the main electrode 163. With the embodiment of FIG. 16, the balanced terminals 161 and 162 may be positioned closely to each other, so that signal input and output leads may be short.

Figure 17:
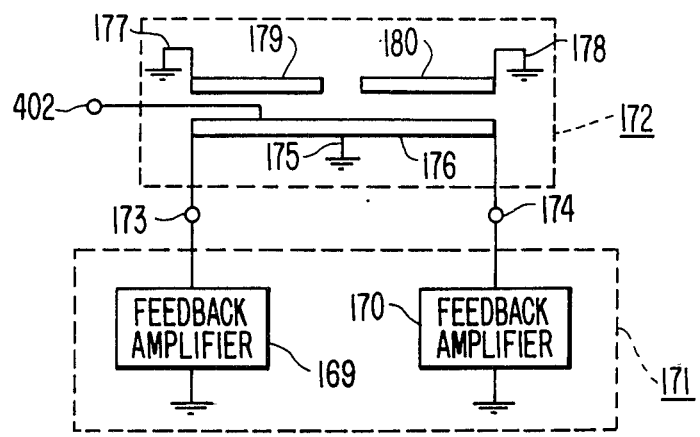

FIG. 17 shows a balanced tuning oscillator device according to still another embodiment of the present invention. A balanced feedback amplifier 171 composed of feedback amplifiers 169 and 170 has input or output terminals connected to balanced terminals 173 and 174 of a balanced tuning circuit 172. The feedback amplifiers 169, 170 are capable of positive-feedback amplification in a mode in which they operate in mutually opposite phases. The balanced tuning circuit 172 has a main electrode 176 having a neutral ground terminal 175 and balanced terminals 173 and 174, the main electrode 176 being of the same construction as that of the main electrode shown in FIG. 15. There are auxiliary electrodes 179 and 180 having ground terminals 177 and 178. The ground terminals 177, 178, 175, and the balanced terminals 173 and 174 may be arranged in the same manner as shown in FIG. 15. An output signal of the balanced tuning oscillator can be obtained at an unbalanced output tap terminal 402 disposed at any position on the main electrode 176. In the embodiments shown in FIGS. 17 and 16, the auxiliary electrodes 179, 180, and 167 may be cut off at desired positions near open terminals thereof to vary distributed capacitances for variably establishing tuning frequencies and also to adjust balanced conditions.

Figure 18:
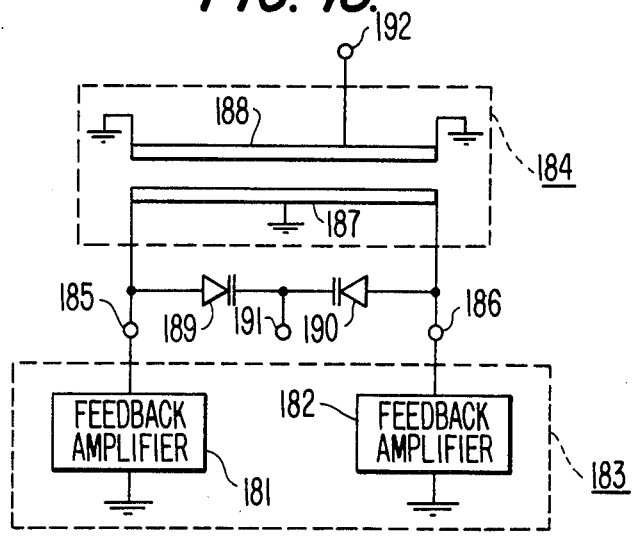

FIG. 18 is illustrative of a balanced tuning oscillator device according to still another embodiment of the present invention. A balanced feedback amplifier 183 composed of feedback amplifiers 181 and 182 has input or output terminals connected to balanced terminals 185 and 186 of a balanced tuning circuit 184. The feedback amplifiers 181 and 182 are capable of positive-feedback amplification in a mode in which they operate in mutually opposite phases. The balanced tuning circuit 184 has a main electrode 187 and an auxiliary electrode 188 which are arranged in the same manner as shown in FIG. 15. Voltage-variable capacitance diodes 189 and 190 are connected to the balanced terminals 185 and 186. Designated at 191 is a control voltage terminal, and terminal 192 is an unbalanced output tap terminal. With this embodiment, it is possible to construct a balanced variable tuning circuit capable of variably controlling a tuning frequency and of being connected to an unbalanced signal circuit system. The voltage-variable capacitance diodes 189 and 190 may be replaced with variable air capacitors.

The balanced tuning circuit 184 employed in the tuning oscillator device shown in FIG. 18 may be replaced with one shown in FIG. 16 or 17, other than one shown in FIG. 15. Where the balanced tuning circuit 184 is replaced wth one illustrated in FIG. 16 or 17, the auxiliary electrode 167 or the auxiliary electrodes 179 and 180 may cut off at desired positions to select a tuning frequency as desired and adjust a balanced condition.

The balanced feedback amplifier in each of the above embodiments may comprise a differential feedback amplifer composed of bipolar transistors, FETs, or their ICs, or a push-pull feedback amplifier.

As described above, the balanced tuning circuit comprises electrodes disposed in confronting relationship with a thin dielectric interposed therebetween or in a juxtaposed relationship on a surface of a dielectric, the balanced tuning circuit being connected between balanced output terminals or balanced input terminals of a balanced feedback amplifier. Therefore, the balanced tuning circuit has the following advantages:

(1) A balanced tuning circuit is composed of a simple unitary construction of an inductor component and a capacitor component, so that a balanced oscillator device is of a highly simple arrangement.

(2) Since the balanced tuning circuit is of a low profile and a small size, the balanced oscillator device can also be of a low profile and a small size, and the amount of unwanted radiation from the balanced oscillator device can be greatly reduced. Therefore, a stable oscillator system can be achieved.

(3) Since the inductor and capacitor of the balanced tuning circuit are connected without a lead, the balanced tuning circuit is free from the influence of any lead inductance and stray capacitance, and hence the operation of the tuning circuit is highly stabilized, the tuning accuracy is improved, and a completely balanced condition can be maintained.

(4) As the balanced tuning circuit can be fabricated as a module, the constants of the inductor and capacitor are not varied when subjected to mechanical vibrations, and the tuning frequency and the balanced condition are quite stable.

(5) By constructing the dielectric substrate of a material which is less temperature-dependent, the balanced tuning circuit has a tuning frequency and a balanced condition that are highly stable against variations in the ambient temperature.

(6) Because of the advantages (3), (4), and (5), the balanced condition of the balanced tuning oscillator device is maintained not only during an initial period but also over an extended period of time. Therefore, even-numbered harmonics of the oscillated signal can ideally be cancelled out to stably reduce the distortion rate of the oscillated signal.

(7) It is possible to reduce the number of parts of the balanced tuning circuit, so that the manufacturing process for the balanced tuning circuit can be improved and the cost of manufacture can be lowered.

(8) By using dielectric in the balanced tuning circuit as a circuit board or substrate for the feedback amplifier, the mounting arrangement of the balanced tuning amplfier device is improved.

Figure 19:
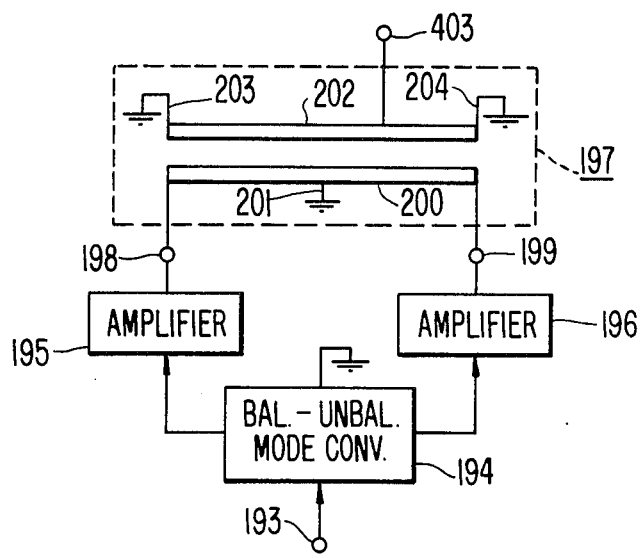

FIG. 19 shows a tuning amplifier device according to an embodiment of the present invention. An unbalanced signal applied to an input terminal 193 is converted into balanced signals by an unbalanced-to-balanced mode converter 194, and the balanced signals are applied to and amplified by amplifiers 195 and 196 in an opposite-phase mode. Amplified outputs are supplied to balanced terminals 198 and 199 of a balanced tuning circuit 197. The balanced tuning circuit 197 has a main electrode 200 having a neutral ground terminal 201 and providing a distributed inductance, the main electrode 200 having balanced terminals 198 and 199. An auxiliary electrode 202 is disposed in a confronting relationship to the main electrode 200 with a dielectric (not shown) interposed therebetween, and has opposite ends serving as ground terminals 203 and 204. A hypothetical neutral point may be produced without providing the ground terminal 201 of the main electrode 200, so that an equivalent ground terminal can be achieved. The balanced terminals 198 and 199 may be connected to any positions on the main electrode 200 which present desired impedances, rather than at the ends of the main electrode 200. The ground terminals 203 and 204 of the auxiliary electrode 202 may also be connected to desired positions on the auxiliary electrode 202. An output signal of the tuning amplifier device can be obtained at an unbalanced output tap terminal 403 and disposed at any position on the auxiliary electrode 202. According to the embodiment of FIG. 19, the balanced tuning circuit can be constructed simply of single main and auxiliary electrodes.

Figure 20:
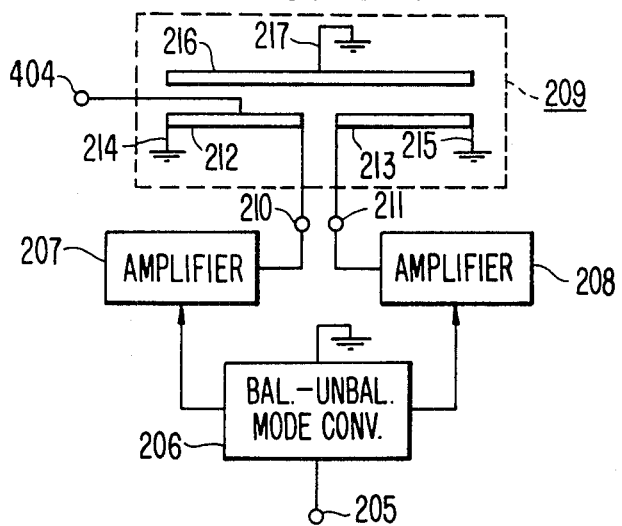

FIG. 20 illustrates a tuning amplifier device according to another embodiment of the present invention. An unbalanced signal applied to an input terminal 205 is converted into balanced signals by an unbalanced-to-balanced mode converter 206, and the balanced signals are applied to and amplified by amplifiers 207 and 208 in an opposite-phase mode. Amplified outputs are supplied to balanced terminals 210 and 211 of a balanced tuning circuit 209. The balanced tuning circuit 209 has main electrodes 212 and 213 having neutral ground terminals 214 and 215 and balanced terminals 210 and 211. An auxiliary electrode 216 is disposed in a confronting relation to the main electrodes 212 and 213 with a dielectric (not shown) interposed therebetween, and has a ground terminal 217 positioned in a substantially confronting relationship to the balanced terminals 210 and 211. The balanced terminals 210 and 211 may be connected to any positions on the main electrodes 212 and 213 which present desired impedances, rather than at the ends of the main electrodes 212 and 213. An output signal of the tuning amplifier device can be obtained at an unbalanced output tap terminal 404 disposed at any position on the main electrode 212. With the embodiment of FIG. 20, the balanced terminals 210 and 211 may be positioned closely to each other, so that signal input and output leads may be short.

FIG. 21 shows a tuning amplifier device according to still another embodiment of the present invention. An unbalanced signal applied to an input terminal 218 is converted into balanced signals by an unbalanced-to-balanced mode converter 219, and the balanced signals are applied to and amplified by amplifiers 220 and 221 in an opposite-phase mode. Amplified outputs are supplied to balanced terminals 223 and 224 of a balanced tuning circuit 222. The balanced tuning circuit 222 has a main electrode 226 having a neutral ground terminal 225 and balanced terminals 223 and 224, the main electrode 226 is of the same construction as that of the main electrode shown in FIG. 19. There are auxiliary electrodes 229 and 230 having ground terminals 227 and 228. The ground terminals 225, 227, and 228, and the balanced terminals 223 and 224 may be arranged in the same manner as shown in FIG. 19. An output signal of the tuning amplifier device can be obtained at an unbalanced output tap terminal 405 disposed at any position on the main electrode 226. In the embodiments shown in FIGS. 21 and 20, the auxiliary electrodes 229, 230, and 216 may be cut off at desired positions near open terminals thereof to vary distributed capacitances for variably establishing tuning frequencies and to also to adjust balanced conditions.

FIG. 22 is illustrative of a tuning amplifier device according to still another embodiment of the present invention. An unbalanced signal applied to an input terminal 231 is converted into balanced signals by a balanced tuning circuit 232, and the balanced signals are applied to and amplified by amplifiers 233 and 234 in an opposite-phase mode. Amplified outputs are supplied to balanced terminals 236 and 237 of a balanced tuning circuit 235. The balanced tuning circuits 235 and 232 have main and auxiliary electrodes 238 and 238 and 245 and 246 in the same arrangement as that shown in FIG. 19. To the balanced terminals 236 and 237 and 243 and 244, there are connected voltage-variable capacitance diodes 240 and 241 and 247 and 148. Designated at 242 and 249 are common control voltage terminals for the voltage-variable capacitance diodes 240 and 241 and 247 and 248, the control voltage terminal 242 serves as an unbalanced secondary output tap terminal. Although the unbalanced tuning circuits 232 and 235 are shown as being of the same construction as that shown in FIG. 19, they may be constructed as shown in FIG. 20 or 21. With the embodiment of FIG. 22, the balanced variable tuning circuit can variably control a tuning frequency and can be connected to an unbalanced signal circuit system. The voltage-variable capacitance diodes 240 and 242 and 247 and 248 may be replaced by variable air capacitors. Where the balanced tuning circuit 235 is replaced with the one illustrated in FIG. 20 or 21, the auxiliary electrode 216 or the auxiliary electrodes 229, 230 may be cut off at desired positions to select a tuning frequency band as desired and adjust a balanced condition.

The balanced amplifier in each of the above embodiments may comprise a push-pull amplifier or a differential amplifier. The unbalanced-to-balanced mode converter may comprise a wide-range balun or a combination of a tuning circuit and a secondary balanced output coil.

As described above, the balanced tuning circuit comprises balanced electrodes disposed in a confronting relationship with a thin dielectric interposed therebetween or in a juxtaposed relationship on a suface of a dielectric, the balanced tuning circuit being connected between balanced output terminals of a balanced amplifier. Therefore, the balanced tuning circuit has the following advantages:

(1) A balanced tuning circuit is composed of a simple unitary construction of an inductor component and a capacitor component, so that a balanced tuning amplifier device is of a highly simple arrangement.

(2) Since the balanced tuning circuit is of a low profile and a small size, the balanced tuning amplifier device can also be of a low profile and a small size, and the amount of unwanted radiation from the balanced tuning circuit can be greatly reduced. Therefore, a stable amplifier system can be achieved.

(3) Since the inductor and capacitor of the balanced tuning circuit are connected without a lead, the balanced tuning circuit is free from the influence of any lead inductance and stray capacitance, and hence the operation of the tuning circuit is highly stabilized, the tuning accuracy is improved, and a completely balanced condition can be maintained.

(4) As the balanced tuning circuit can be fabricated as a module, the constants of the inductor and capacitor are not varied when subjected to mechanical vibrations, and the tuning frequency and the balanced condition are quite stable.

(5) By constructing the dielectric substrate of a material which is less temperature-dependent, the balanced tuning circuit has a tuning frequency and a balanced condition that are highly stable against variations in the ambient temperature.

(6) Because of the advantages (3), (4), and (5), the balanced condition of the balanced tuning amplifier device is maintained not only during an initial period but also over an extended period of time. Therefore, even-numbered harmonics of the oscillated signal can ideally be cancelled out to stably reduce the distortion rate of the amplified signal.

(7) It is possible to reduce the number of parts of the balanced tuning circuit, so that the manufacturing process for the balanced tuning amplifier device can be improved and the cost of manufacture can be lowered.

(8) By using the dielectric in the balanced tuning circuit as a circuit board or substrate for the feedback amplifier, the mounting arrangement of the balanced tuning amplifier device is improved.

FIG. 23 shows a balanced mixer device according to an embodiment of the present invention. An unbalanced signal applied to an input terminal 250 is converted into balanced signals by an unbalanced-to-balanced mode converter 251, and the balanced signals are applied to mixers 252 and 253. An unbalnced signal applied to an input terminal 254 is supplied directly to the mixers 252 and 253. The signals are mixed in an opposite-phase mode by the mixers 252 and 253, and an intermediate-frequency signal output produced in a balanced mode by mixing the applied signals is supplied to balanced terminals 256 and 257 of a balanced tuning circuit 255. The balanced tuning circuit 255 has a main electrode 258 having a neutral ground terminal 259 and providing a distributed inductance and the main electrode 258 has balanced terminals 256 and 257. An auxiliary electrode 260 is disposed in a confronting relationship to the main electrode 258 with a dielectric (not shown) interposed therebetween, and has opposite ends serving as ground terminals 261 and 262. A hypothetical neutral point may be produced without providing the ground terminal 259 of the main electrode 258, so that an equivalent ground terminal can be achieved. The balanced terminals 256 and 257 may be connected to any positions on the main electrode 258 which present desired impedances, rather than at the ends of the main electrode 258. The ground terminals 261 and 262 of the auxiliary electrode 260 may also be connected to desired positions on the auxiliary electrode 260. An output signal of the balanced mixer device can be obtained at an unbalanced output tap terminal 406 disposed at any position on the auxiliary electrode 260. According to the embodiment of FIG. 23, the balanced tuning circuit can be constructed simply of single main and auxiliary electrodes.

Figure 24:
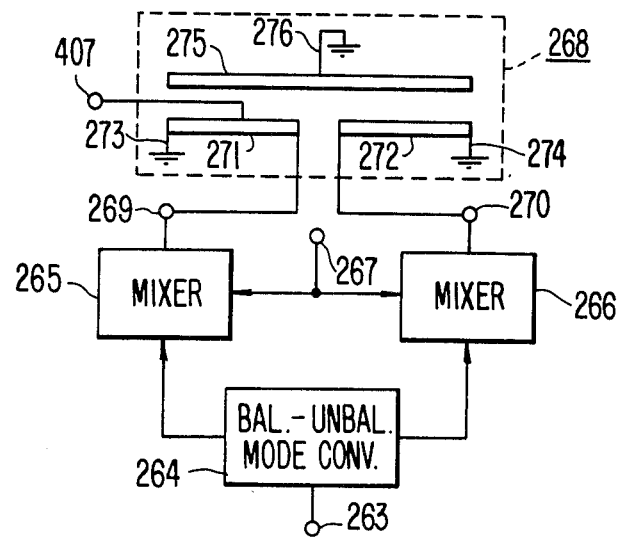

FIG. 24 illustrates a balanced mixer device according to another embodiment of the present invention. An unbalanced signal applied to an input terminal 263 is converted into balanced signals by an unbalanced-to-balanced mode converter 264, and the balanced signals are applied to mixers 265 and 266. An unbalanced signal applied to an input terminal 267 is supplied directly to the mixers 265 and 266. The signals are mixed in an opposite-phase mode by the mxers 265 and 266, and an intermediate-frequency signal output produced in a balanced mode by mixing the applied signals is supplied to balanced terminals 269 and 270 of a balanced tuning circuit 268. The balanced tuning circuit 268 has main electrodes 271 and 272 having neutral ground terminals 273 and 274 and balanced terminals 269 and 270. An auxiliary electrode 257 is disposed in a confronting relationship to the main electrodes 271 and 272 with a dielectric (not shown) interposed therebetween, and has a ground terminal 276 positioned in a substantially confronting relationship to the balanced terminals 269 and 270. The balanced terminals 269 and 270 may be connected to any positions on the main electrodes 271 and 272 which present desired impedances, rather than at the ends of the main electrodes 271 and 272. An output signal of the balanced mixer device can be obtained at an unbalanced output tap terminal 407 disposed at any position on the main electrode 271. With the embodiment of FIG. 24, the balanced terminals 269, 270 may be positioned closely to each other, so that signal input and output leads may be short.

Figure 25:
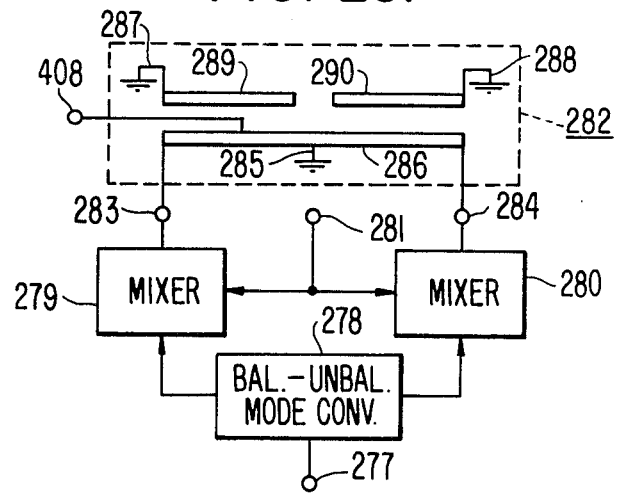

FIG. 25 illustrates a balanced mixer device according to still another embodiment of the present invention. An unbalanced signal applied to an input terminal 277 is converted into balanced signals by an unbalanced-to-balanced mode converter 278, and the balanced signals are applied to mixers 279 and 280. An unbalanced signal applied to an input terminal 281 is supplied directly to the mixers 279 and 280. The signals are mixed in an opposite-phase mode by the mixers 279 and 280, and an intermediate-frequency signal output produced in a balanced mode by mixing the applied signals is supplied to balanced terminals 298 and 299 of a balanced tuning circuit 282. The balanced tuning circuit 282 has a main electrode 286 having a neutral ground terminal 285 and balanced terminals 283 and 284, the main electrode 286 is of the same construction as that of the main electrode shown in FIG. 23. There are auxiliary electrodes 289 and 290 having ground terminals 287 and 288. The ground terminals 287, 288 and 285, and the balanced terminals 283 and 284 may be arranged in the same manner as shown in FIG. 23. An output signal of the balanced mixer device can be obtained at an unbalanced output tap terminal 408 disposed at any position on the main electrode 286. In the embodiments shown in FIGS. 25 and 24, the auixiliary electrodes 289, 290, and 275 may be cut off at desired positions near open terminals thereof to vary distributed capacitances for variably establishing tuning frequencies and also to adjust balanced conditions.

Figure 26:
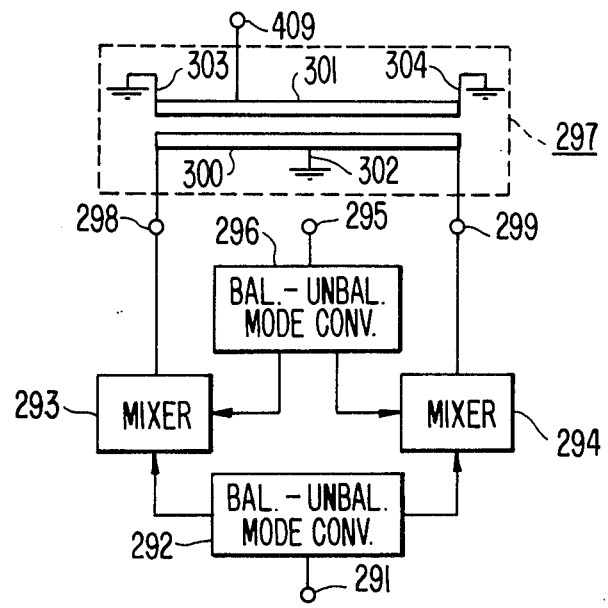

FIG. 26 is illustrative of a double-balanced mixer device according to a still further embodiment of the present invention. An unbalanced signal applied to an input terminal 291 is converted into balanced signals by an unbalanced-to-balanced mode converter 292, and the balanced signals are applied to mixers 293 and 294. An unbalanced signal applied to an input terminal 295 is converted by an unbalanced-to-balanced mode converter 296 into balanced signals which are supplied to the mixers 293 and 294. The signals are mixed in an opposite-phase mode by the mixers 293 and 294, and an intermediate-frequency signal output produced in a balanced mode by mixing the applied signals is supplied to balanced terminals 298 and 299 of a balanced tuning circuit 297. The balanced tuning circuit 297 has a main electrode 300, an auxiliary electrode 301, ground terminals 302, 303 and 304, and balanced terminals 298 and 299, which are arranged in the same manner as shown in FIG. 23. An output signal of the double-balanced mixer device can be obtained at an unbalanced output tap terminal 409 disposed at any position on the auxiliary electrode 301.

Figure 27:
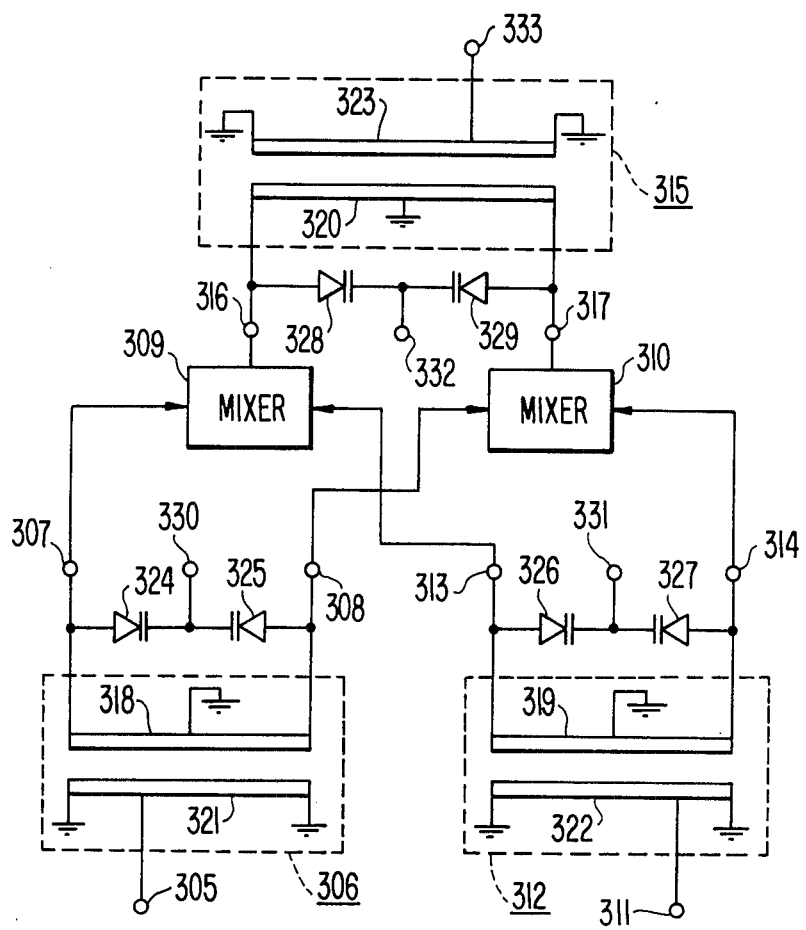

FIG. 27 shows a double-balanced mixer device according to still another embodiment of the present invention. An unbalanced signal applied to an input terminal 305 is converted into balanced signals by an unbalanced-to-balanced mode converter 306, and the balanced signals are applied through balanced terminals 307 and 308 to mixers 309 and 310. An unbalanced signal applied to an input terminal 311 is converted into balanced signals by an unbalanced-to-balanced mode converter 312, and the balanced signals are applied through balanced terminals 313 and 314 to the mixers 309 and 310. The signals are mixed in an opposite-phase mode by the mixers 309 and 310, and an intermediate-frequency signal output produced in a balanced mode by mixing the applied signals is supplied to balanced terminals 306 and 317 of a balanced tuning circuit 315. The balanced tuning circuits 306, 312 and 315 have main electrodes 318, 318 and 320 and auxiliary electrodes 321, 322, 323 in the same arrangement as that shown in FIG. 23. To the balanced terminals 307 and 308, 313 and 314; and 316 and 317, there are connected voltage-variable capacitance diodes 324 and 325 and 326 and 327, and 328 and 329. Designated at 330, 331 and 332 are control voltage terminals, and 333 an unbalanced secondary output tap terminal. With the embodiment of FIG. 27, the balanced variable tuning circuit can variably control a tuning frequency and can be connected to an unbalanced signal circuit system. The voltage-variable capacitance diodes 324 through 329 may be replaced by variable air capacitors. The balanced tuning circuits 297, 306, 312 and 315 in the mixer devices shown in FIGS. 26 and 27 may be composed of the one shown in FIG. 24 or 25, in addition to the one shown in FIG. 23. Where the balanced tuning circuits 297, 306, 312 and 315 are replaced with the one illustrated in FIG. 24 or 25, the auxiliary electrode 275 or the auxiliary electrodes 289 and 290 may be cut off at desired positions to select a tuning frequency band as desired and adjust a balanced condition. The mixer device can perform the desired function without the voltage-variable capacitance diodes 328 and 329 disposed at an intermediate-frequency output stage in the embodiment of FIG. 27.

The balanced mixer or the double-balanced mixer in each of the above embodiments may be composed of diodes, transistors, or FETs. The unbalanced-to-balanced mode converter may comprise a wide-range balun or a combination of a general tuning circuit and a secondary balanced output coil.

As described above, the balanced tuning circuit comprises balanced electrodes disposed in a confronting relationship with a thin dielectric interposed therebetween or in a juxtaposed relationship on a surface of a dielectric, the balanced tuning circuit being connected between balanced intermediate-frequency output terminals of a balanced or double-balanced mixer. Therefore, the balanced tuning circuit has the following advantages:

(1) A balanced tuning circuit is composed of a simple unitary construction of an inductor component and a capacitor component, so that a balanced mixer device is of a highly simple arrangement.

(2) Since the balanced tuning circuit is of a low profile and a small size, the balanced mixer device can also be of a low profile and a small size, and the amount of unwanted radiation from the balanced tuning circuit can be greatly reduced. Therefore, a stable mixer system can be achieved.

(3) Since the inductor and capacitor of the balanced tuning circuit are connected without a lead, the balanced tuning circuit is free from the influence of any lead inductance and stray capacitance, and hence the operation of the tuning circuit is highly stabilized, the tuning accuracy is improved, and a completely balanced condition can be maintained.

(4) As the balanced tuning circuit can be fabricated as a module, the constants of the inductor and capacitor are not varied when subjected to mechanical vibrations, so that tuning frequency and balanced condition of the balanced tuning circuit are quite stable.

(5) By constructing the dielectric substrate of a material which is less temperature-dependent, the balanced tuning circuit has a tuning frequency and a balanced condition that are highly stable against variations in the ambient temperature.

(6) Because of the advantages (3), (4), and (5), the balanced condition of the balanced mixer device is maintained not only during an initial period but also over an extended period of time. Therefore, even-numbered harmonics of the oscillated signal can ideally be cancelled out to stably reduce the distortion rate of the amplified signal. The balanced mixer device can thus well prevent spurious interference and intermodulation interference which would be caused when a signal of a high voltage level is applied, with the result that the distortion rate of the intermediate-frequency output signal can stably be reduced and the S/N ratio can be improved.

(7) It is possible to reduce the number of parts of the balanced tuning circuit, so that the manufacturing process for the balanced mixer device can be improved and the cost of manufacture can be lowered.

(8) By using the dielectric in the balanced tuning circuit as a circuit board or substrate for the mixer, the mounting arrangement of the balanced balanced mixer device is improved.

Figure 28:
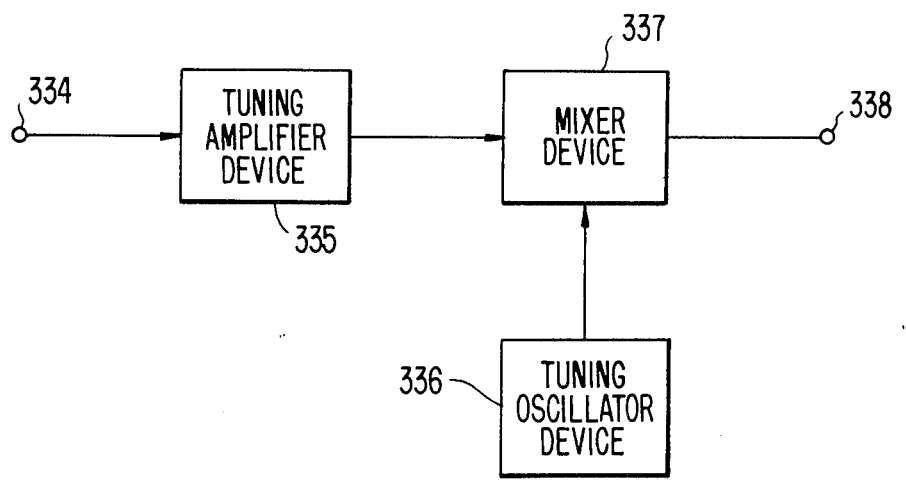
FIG. 28 is a block diagram of a superheterodyne tuning system according to an embodiment of the present invention.

FIG. 28 is shows in block diagram of a superheterodyne tuning system according to an embodiment of the present invention. A signal applied to an antenna terminal 334 is amplified by a tuning amplifier device 335 into an amplified signal which is supplied to a mixer device 337. An oscillator output signal from a tuning oscillator device 336 is supplied to the mixer device 337. The antenna input signal and the oscillator output signal are mixed by the mixer device 337 to output an intermediate-frequency signal to an intermediate-frequency output terminal 338. The tuning amplifier device 335 may comprise the one shown in FIGS. 7 through 9 or FIGS. 19 through 22, and the tuning oscillator device may comprise the one shown in FIGS. 5, 6, or 12 through 18. The mixer device 337 may comprise the one illustrated in FIGS. 10, 11, or 23 through 27.

The tuning circuits 23, 33, 43, 48, 54, 58, 72, 79, 80, 81, 97, 112, and 129 in the tuning systems in the embodiments shown in FIGS. 5 through 14 will be described hereinbelow.

FIGS. 29(a), 29(b) and 29(c) through 32(a), 32(b) and 32(c) illustrate the constructions of tuning circuits according to embodiments of the present invention.

Figure 29A:
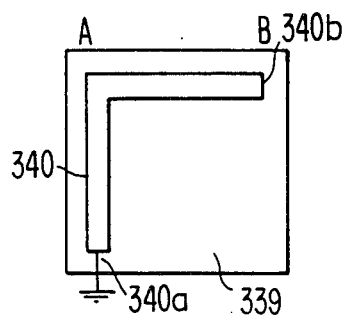
FIGS. 29($a$), 29($b$), 29($c$) through 32($a$), 32($b$), 32($c$) are front, side, and rear elevational views of tuning circuits for use in the tuning system of the present invention.
Figure 29B:
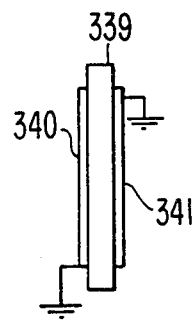
Figure 29C:
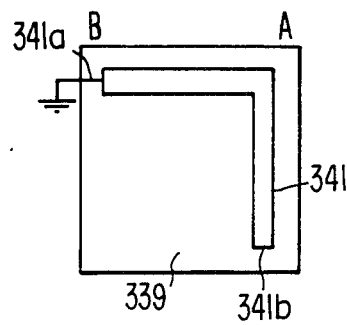

In FIGS. 29(a), 29(b) and 29(c), a dielectric 339 in the form of a plate is made of ceramic and supports an electrode 340 forming an inductor on a surface of the dielectric 339 and another electrode 341 disposed on an opposite surface of the dielectric 339 in a confronting relationship to the electrode 340. The electrodes 340 and 341 jointly form a distributed-constant circuit forming a capacitor. The electrode 340 includes a ground terminal 340a and an open terminal 340b, and the electrode 341 includes a ground terminal 341a and an open terminal 341b which are opposite to the terminals 340b and 340a, respectively. Each of the electrodes 340 and 341 has one bent portion having a desired bent angle and direction.

Figure 30A:
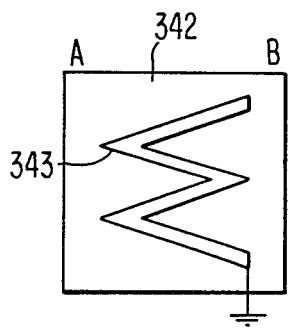
Figure 30B:
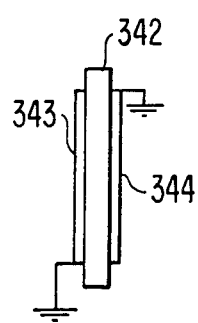
Figure 30C:
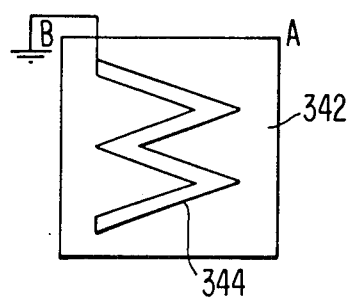
Figure 31A:
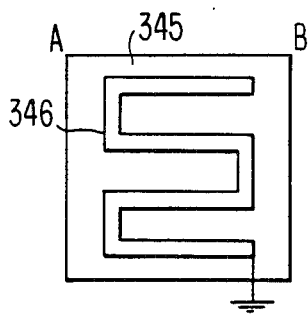
Figure 31B:
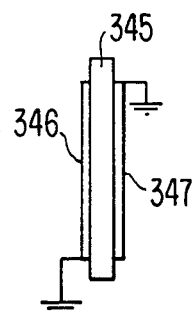
Figure 31C:
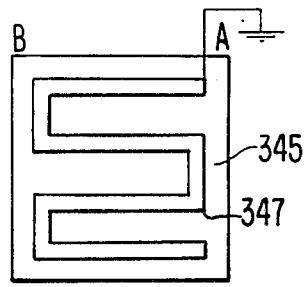

In FIGS. 30(a) through 30(c), electrodes 343 and 344 are mounted on opposite surfaces of a dielectric 342 in the from of a plate, and in FIGS. 31(a) through 32(c), electrodes 346 and 347 are mounted on opposite surfaces of a dielectric 345 in the from of a plate. As illustrated in FIGS. 30(a) through 30(c) and 31(a) through 31(c), the electrodes are mounted on the dielectrics and have a terminal arrangement in the same manner as described with reference to the embodiment of FIGS. 29(a) through 29(c). However, each of the electrodes has more than one bent portion having a desired bent angle and direction.

Figure 32A:
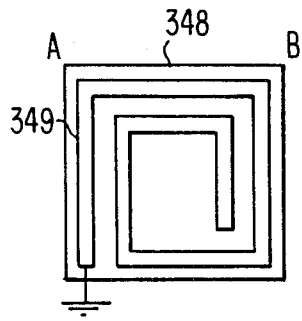
Figure 32B:
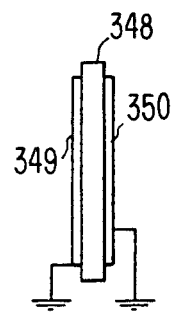
Figure 32C:
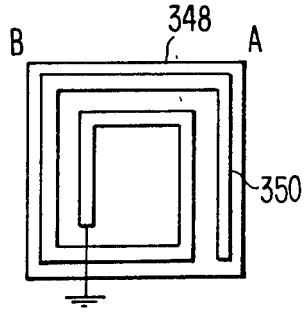

In FIGS. 32(a) through 32(c), electrodes 349 and 350 are mounted on opposite surfaces of a dielectric 348 in the from of a plate. The electrodes are mounted on the dielectrics and have a terminal arrangement in the same manner as described with reference to the embodiment of FIGS. 29(a) through 29(c). However, each of the electrodes has a spiral configuration.

Although in the embodiments shown in FIGS. 29(a), 29(b) and 29(c) through 32(a), 32(b) and 32(c) each electrode has a bent portion formed as an angular pattern having a desired bent angle, the electrode may instead have a bent portion formed as an arcuate pattern having a desired curvature.

Figure 33A:
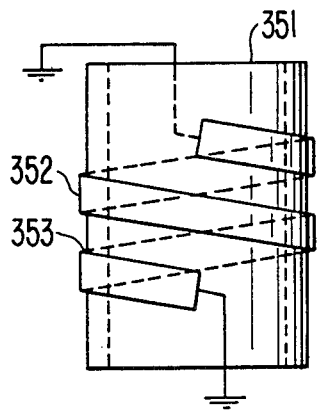
FIGS. 33($a$) and 33($b$) are side and front elevational views of a tuning circuit for use in the tuning system of the invention.
Figure 33B:
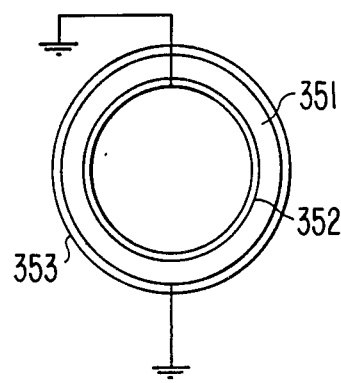

FIGS. 33(a) and 33(b) show the construction of a tuning circuit according to another embodiment of the present invention. A tubular dielectric 351 supports an electrode 352 on an inner peripheral surface thereof and an electrode 353 on an outer peripheral surface thereof, the electrodes 352 and 353 extending in a confronting relationship to each other. The electrodes 352 and 353 have ground terminals located at opposite ends thereof. The dielectric 351 may be in the form of a hollow structure having a rectangular cross-section.

The terminals that are designated as ground terminals in the foregoing embodiments may not be used as ground terminals but may serve as general common terminals for connection to other circuits (not shown).

The tuning circuits shown in FIGS. 29(a), 29(b) and 29(c) through 32(a), 32(b) and 32(c) can form relatively large distributed inductors and capacitors though they take up small areas. Therefore, small tuning circuits having relatively low tuning frequencies can be achieved with a resulting increased space factor.

The tuning circuit shown in FIGS. 33(a) and 33(b) is smaller in size than the tuning circuits shown in FIGS. 29(a), 29(b) and 29(c) through 32(a), 32(b) and 32(c), but can form a sufficient large inductor and capacitor. Therefore, a much smaller tuning circuit having a sufficiently tuning frequency can be accomplished. The tuning circuit of FIGS. 33(a) and 33(b) can be mass-produced with ease by continuously forming electrodes 352 and 353 on an elongate continuous tubular dielectric 351 and then cutting off the tubular dielectric 351 to desired lengths.

The electrodes, or transmission-line electrodes, in the foregoing embodiments may be constructed of a metal conductor, a printed metal-foil conductor, a printed thick-film conductor, or a thin-film conductor, or may comprise a combination of these conductors. The dielectric may be made of alumina ceramic, barium titanate, plastics, Teflon (trademark), glass, mica, or in the form of a printed-circuit board of a resin base.

The balanced tuning circuits 149, 160, 172, 184, 197, 209, 222, 232, 235, 255, 268, 282, 297, 306, 312, and 315 in the balanced tuning systems in the embodiments shown in FIGS. 15 through 27 will be described hereinbelow.

FIGS. 34(a), 34(b) and 34(c) and 35(a), 35(b) and 35(c) are illustrative of the balanced tuning circuit for use in the balanced tuning systems shown in FIGS. 15, 18, 19, 22, 23, 26, 27, and also of the construction of main and auxiliary electrodes and a dielectric for the balanced tuning circuits shown in FIGS. 31 and 32.

Figure 34A:
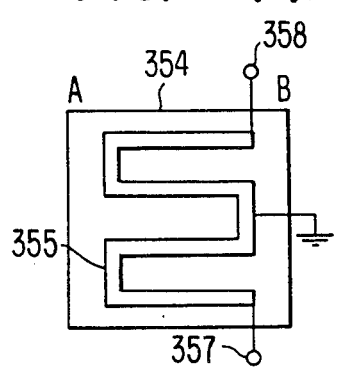
FIGS. 34($a$), 34($b$), 34($c$) through 35($a$), 35($b$), 35($c$) are front, side, and rear elevational views of tuning circuits for use in the tuning system of the present invention.
Figure 34B:
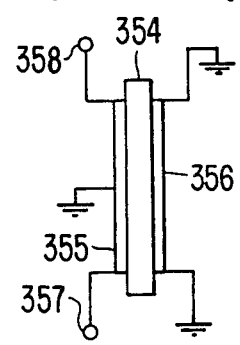
Figure 34C:
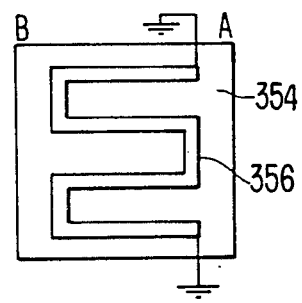
Figure 35A:
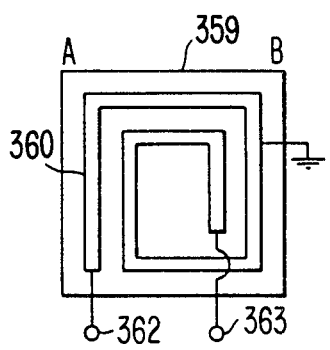
Figure 35B:
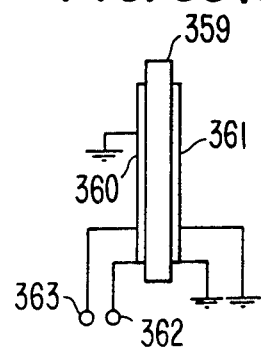
Figure 35C:
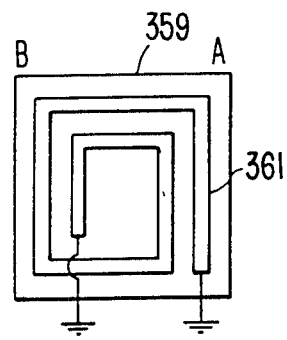

In FIGS. 34(a) through 34(c), the tuning circuit has a dielectric base plate or substrate 354 and electrodes 355, 356 forming a distributed-constant circuit providing a distributed inductor and a distributed capacitor. The electrodes 355 and 356 have ground terminals positioned remotely from each other between the confronting electrodes as shown in FIGS. 34(a) through 34(c). (The ground terminals in FIGS. 35(a) through 35(c) are similarly arranged.) Sides A and B shown in FIG. 34(a) correspond respectively to sides A and B in FIG. 34(c) (This also holds true in FIGS. 35(a) through 35(c).)

In FIGS. 34(a) through 34(c), the electrodes 355 and 356 of a meandering configuration are disposed in a confronting relationship to each other with the dielectric substrate 354 interposed therebetween.

In FIGS. 35(a) through 35(c), electrodes 360 and 361 of a spiral configuration are disposed in confronting relation to each other with a dielectric substrate 357 interposed therebetween.

While in the embodiments of FIGS. 34(a) through 34(c) and 35(a) through 35(c) the electrodes disposed in a confronting or juxtaposed relationship are of the same shape and fully confront each other over their entire surfaces, one of the electrodes may have a different equivalent length than that of the other electrode, or the companion electrodes may confront each other only partially.

Designated in FIGS. 34(a) through 34(c) and 35(a) through 35(c) at 357, 358, 362, 363 are balanced terminals.

Operation of the tuning circuit for the tuning system in each of the foregoing embodiments will now be described.

Figure 36A:
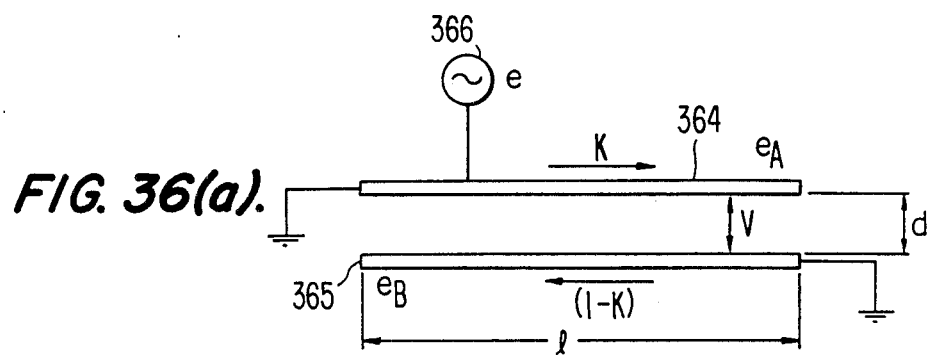
FIGS. 36($a$) through 36($e$), 37($a$) and 37($b$), and 38 are diagrams explanatory of the principles of operation of the tuning circuit of the invention.

FIGS. 36(a) through 36(e) are circuit diagrams of equivalent circuits of the tuning circuit of the present invention. In FIG. 36(a), transmission lines are composed of transmission-line electrodes 364 and 365 having an electrical length l and including ground terminals disposed at opposite ends. A signal source 366 for generating a voltage e is connected to the transmission-line electrode 364 for supplying a signal thereto. When the signal is applied, a traveling-wave voltage $e_A$ is excited at the open terminal on the distal end of the transmission-line electrode 364. Since the transmission-line electrode 365 is disposed in a confronting or juxtaposed relationship to the transmission-line electrode 364 adjacent thereto, a voltage is induced in the transmission-line electrode 365 by mutual induction. A traveling-wave voltage $e_B$ is then induced at the open terminal on the distal end of the transmission-line electrode 365.

With the ground terminals of the transmission-line electrodes 364 and 365 being disposed in an opposite relationship or remotely from each other, the induced traveling-wave voltage $e_B$ is opposite in phase to the excited traveling-wave voltage $e_A$. As the distal ends of the transmission lines are open, the traveling-wave voltages $e_A$ and $e_B$ form voltage standing waves in the transmission lines which are composed of the transmission-line electrodes 364 and 365, respectively. Assuming that a voltage distribution coefficient indicative of the distribution of the voltage standing wave in the transmission-line electrode 364 is expressed by K, a voltage distribution coefficient of the transmission-line electrode 365 can be expressed by $(1-K)$.

A potential difference V between any desired confronting portion of the transmission-line electrodes 364 and 365 is expressed by:

$$V = Ke_A - (1-K)e_B \quad (1)$$

On the condition that the transmission-line electrodes 364, 365 are of the same electrical length l, $$e_B = -e_A \quad (2)$$

Thus, the potential difference V given by the above equation (1) can now be expressed by:

$$V = Ke_A + (1-K)e_A \quad (3)$$
$$= e_A$$

Therefore, the potential difference V can be generated between all confronting portions of the transmission-line electrodes 364 and 365.

It is assumed here that the transmission-line electrodes 364 and 365 have a width W (with their thickness being small) and are spaced a distance d from each other by a dielectric having a dielectric constant $\epsilon_s$. A capacitance $C_O$ formed per unit length of the transmission lines is given as follows:

$$C_O = \frac{Q}{V} = \frac{Q}{e_A} \quad (4)$$

$$Q = \epsilon_0 \epsilon_s \frac{WV}{d} = \epsilon_0 \epsilon_s \frac{W \cdot e_A}{d} \quad (5)$$

Therefore, $$C_O = \epsilon_0 \epsilon_s (W/d) \quad (6)$$

Figure 36B:
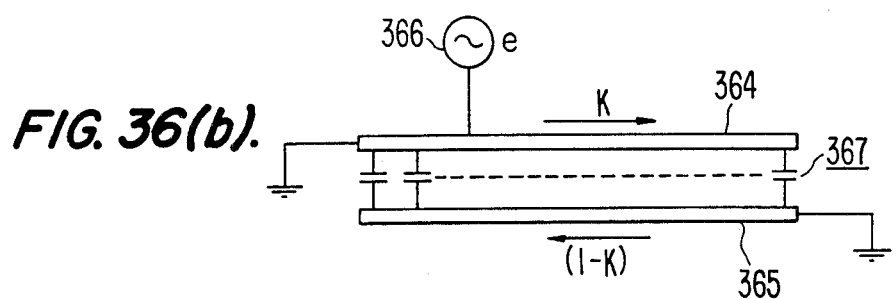
Figure 36C:
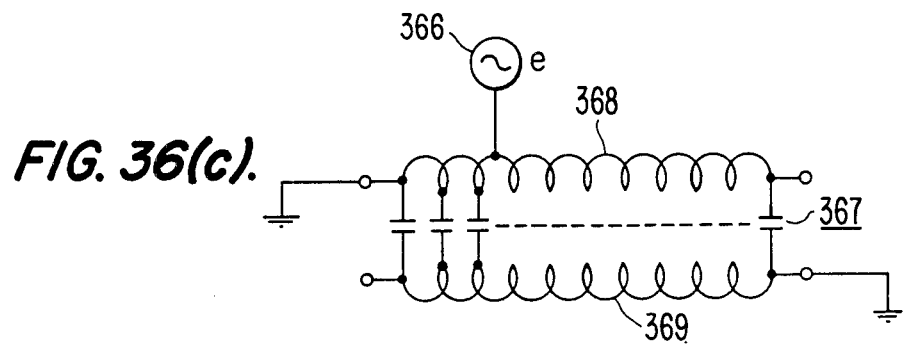

Accordingly, the transmission lines shown in FIG. 36(a) are equivalent to transmission lines as shown in FIG. 36(b) having distributed capacitors 367 of $C_O$ determined by the equation (6) per unit length. As illustrated in FIG. 36(c), the transmission lines can be equivalently expressed as a distributed-constant circuit composed of total distributed inductors 368 and 369 due to distributed inductor components of the transmission lines and lumped inductor components produced by the bent configuration of the transmission lines and a distributed capacitor 367.

Figure 37A:
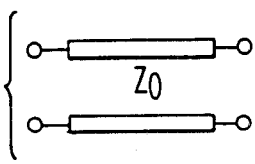
Figure 37B:
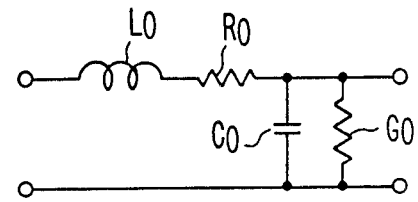

Now, the relationship between the formation of the distributed capacitor 367 and the electrical length l of the transmission lines will be described. A characteristic impedance $Z_O$ per unit length of the transmission lines shown in FIG. 37(a) can be expressed by an equivalent circuit illustrated in FIG. 37(b). The characteristic impedance $Z_O$ is generally given by:

$$Z_O = \sqrt{\frac{R_O + j\omega L_O}{G_O + j\omega C_O}} \quad (7)$$

If the transmission lines cause no loss, $$Z_O = (L_O/C_O) \quad (8)$$

This assumption can be applied to many of the resonator filters according to the embodiments of the invention. For the sake of brevity, the characteristic impedance $Z_O$ defined by the equation (8) will hereinafter be used. The capacitance $C_O$ in the equation (8) is the same as the capacitance $C_O$ per unit length of the transmission lines as determined by the equation (6). More specifically, the characteristic impedance $Z_O$ per unit length of the transmission lines is a function of the capacitance $C_O$, and also a function of the dielectric constant $\epsilon_s$ of the dielectric, the width W of the transmission-line electrodes, and the distance d between the transmission-line electrodes.

An equivalent reactance X at a terminal of a transmission line having a characteristic impedance $Z_O$ per unit length thereof, an electrical length l, and an open distal end can be expressed by:

$$X = -Z_O \cot \theta \quad (9)$$

where $$\theta = 2\pi(l/\lambda) \quad (10)$$

$$\theta = 0 \sim \frac{\pi}{2} \quad (11)$$
$$= \pi \sim \tfrac{3}{2}\pi$$

the equivalent reactance X is given by:

$$X \leqq 0 \quad (12)$$

Therefore, the equivalent reactance at the terminal of the transmission line can be a capacitive reactance. Where $\theta$ falls in the ranges of the equation (11) because of the electrical length l of the transmission line, or by selecting the electrical length l to be $\lambda/4$ or less, a capacitor can be formed. The capacitance C of the capacitor thus formed is:

$$C = \frac{1}{\omega|X|} = \frac{1}{\omega Z_O \cot \theta} \quad (13)$$

$$= \frac{1}{\omega \sqrt{\frac{L_O}{C_O}} \cot\theta}$$

Therefore, any desired capacitance C can be achieved by varying $\theta$ or selecting the electrical length l of the transmission line.

Figure 38:
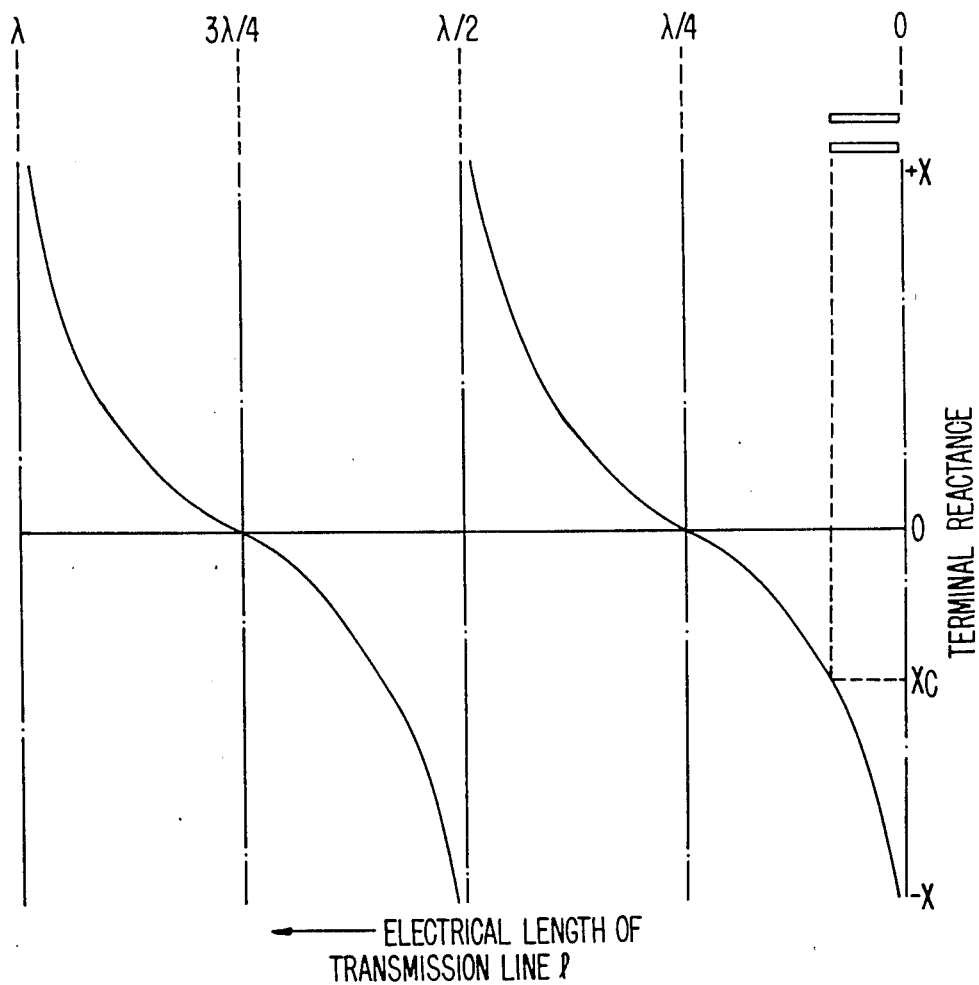

FIG. 38 is illustrative of the mode of operation of the transmission lines described with reference to the above equations (9) through (13). In FIG. 38, the equivalent reactance X generated at the terminals is shown as being varied as the electrical length of the transmission lines with open distal ends varies. As is apparent from FIG. 38, it is possible to form a negative terminal reactance if the electrical length l is $\lambda/4$ or below or in the range of from $\lambda/2$ to $4\lambda/3$, that is, a capacitor can equivalently be formed. Furthermore, under the condition to form a negative terminal reactance, the capacitance C can be of a desired value by selecting any desired electrical length l of the transmission lines.

Figure 36D:
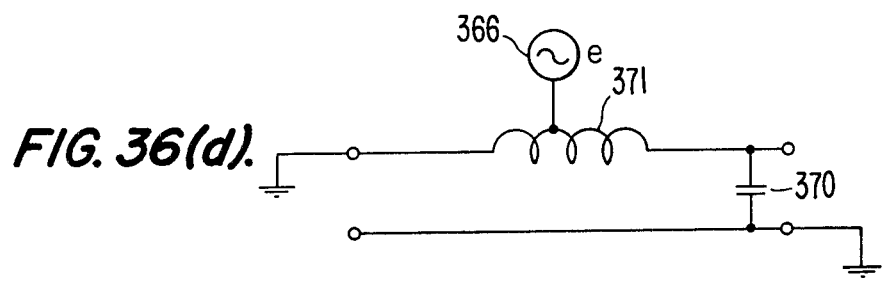
Figure 36E:
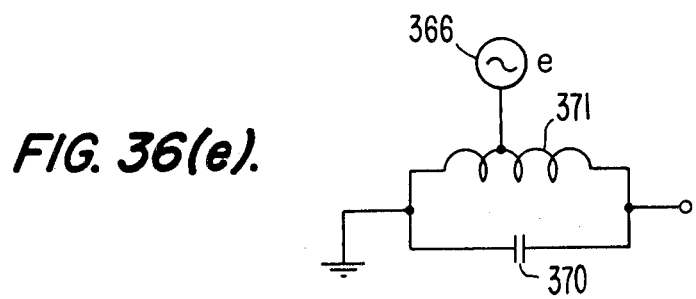

The capacitor C can be equivalently replaced with a lumped-constant capacitor 370 shown in FIG. 36(d). The inductor formed by the total of distributed inductor components present in the transmission lines and lumped inductor components generated by the bending of the transmission lines can be equivalently replaced with a lumped-constant inductor 371. By expressing the ground terminals in FIG. 36(d) as a common ground terminal, the arrangement can finally be equivalent to a parallel resonant circuit as shown in FIG. 36(e) which is composed of a lumped-constant capacitor 370 and a lumped-constant inductor 371, thus realizing a tuning circuit.

The tuning circuit of the invention is realized on the basis of the arrangement and operation described above. The construction and principles of operation of the tuning circuit according to the present invention are entirely different from those of the conventional tuning circuits. To indicate that the tuning circuit of the invention differs entirely from a conventional tuning circuit or another tuning circuit arrangement using the same transmission lines as those in the tuning circuit of the invention, the construction and operation of the conventional tuning circuit or the other tuning circuit arrangement using the same transmission lines will hereinafter be described. This will serve to clarify the difference between the tuning circuit of the invention and the conventional tuning circuit and also the novelty of the tuning circuit of the invention.

Figure 39:
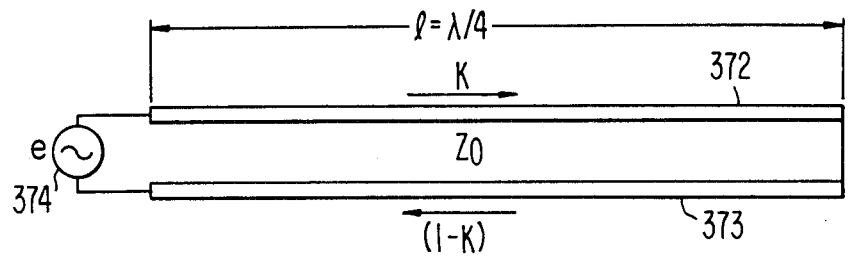
FIG. 39 is a diagram illustrative of the principles of operation of a conventional tuning circuit.

FIG. 39 is illustrative of the circuit arrangement of a quarter-wave resonator which has heretofore been used most widely. The illustrated prior resonator is fully different from the tuning circuit of the invention as to the distal ends of the transmission lines, selection of the length thereof, and selection of ground terminals. In FIG. 39, balanced-mode transmission-line electrodes 372 and 373 have an electrical length l equal to $\lambda/4$ at a resonance frequency and their distal ends short-circuited. The transmission-line electrodes are driven in a balanced mode by a balanced signal source 374 which generates a voltage e. A ground terminal is selected to be located at a neutral point of the balanced signal source 374, and no ground terminal is placed at any terminal of the transmission-line electrodes. An equivalent terminal reactance X produced at the terminals of the transmission lines is given by:

$$X = Z_O \tan \theta \quad (14)$$

where $Z_O$ is a characteristic impedance of the transmission lines and equal to the one indicated by the equation (8) and $\theta$ is equal to the one indicated by the equation (10). The electrical length l of the transmission lines of the resonator is:

$$l = \lambda/4 \quad (15)$$

and hence, $$\theta = \pi/2 \quad (16)$$

Therefore, the terminal reactance X in the equation (14) becomes:

$$X = Z_O \tan (\pi/2) = \infty \quad (17)$$

As a consequence, parallel resonance characteristics can equivalently be obtained. The construction of the quarter-wave resonator above will be compared with that of the tuning circuit of the present invention. With respect to the terminal condition, the terminals of the tuning circuit of the invention are open, whereas those of the conventional quater-wave resonator are short-circuited, so that the terminal conditions are entirely different. As to the electrical length l of the transmission lines, the electrical length of the tuning circuit of the invention is selected to be $\lambda/4$ or shorter, and about $\lambda/16$ in reality. However, the electrical length of the prior quarter-wave resonator is strictly selected to be $\lambda/4$ of the resonance frequency. Therefore, it is apparent that the electrical lengths l of the transmission lines are also basically different from each other. Because of the difference between the electrical lengths of the transmission lines, the tuning circuit of the invention can be of a smaller size when the tuning circuit of the invention and the prior resonator are designed for use at the same tuning frequency or resonance frequency. The quarter-wave resonator is required to have much longer transmission lines, and has to be larger in size. Some prior quarter-wave resonators are rendered smaller in size by shortening the transmission lines with a dielectric having quite a large dielectric constant. The dielectric with a large dielectric constant is generally subjected to a high dielectric loss tan $\delta$, and the Q of the resonator tends to be greatly reduced. Furthermore, the dielectric constant of the dielectric with a high dielectric constant is generally highly temperature-dependent, and it is difficult to maintain the stability of a tuning frequency.

Figure 40A:
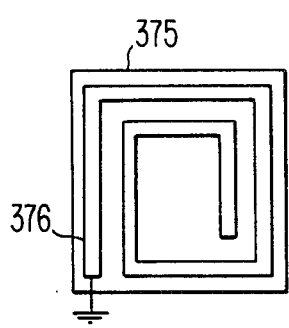
FIGS. 40($a$) through 40($c$) are front, side, and rear elevational views of a tuning circuit, explanatory of a method of adjusting a tuning frequency of the tuning system of the invention.
Figure 40B:
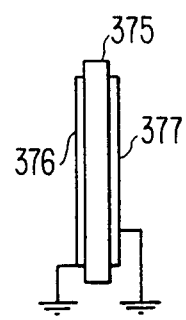
Figure 40C:
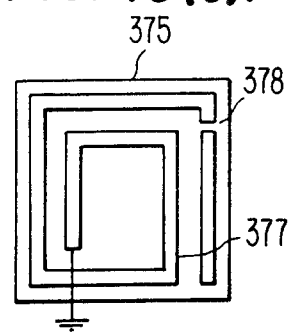

FIGS. 40(a) through 40(c) are illustrative of the construction of a tuning circuit according to still another embodiment of the present invention, as representing the embodiment shown in FIGS. 32(a) through 32(c). Electrodes 376, 377 are mounted on opposite surfaces of a dielectric 375 in the form of a plate. The electrodes are mounted on the dielectrics and have a terminal arrangement in the same manner as described with reference to the embodiment of FIGS. 32(a) through 32(c). Each of the electrodes has a spiral configuration.

If it is desired to adjust the capacitance of the distributed capacitor or the inductance of the distributed inductor, the electrode 377 is cut off at a desired portion 378.

The severance of the electrode will be described in greater detail.

Figure 41A:
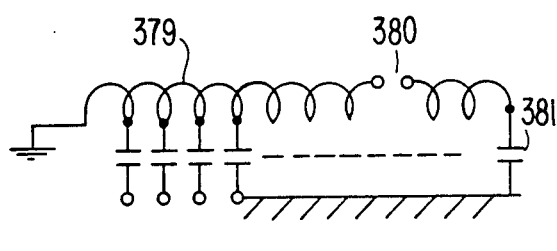
FIGS. 41($a$) and 41($b$) are circuit diagrams of equivalent circuits, explanatory of a method of adjusting a tuning frequency of the tuning system of the invention.

By cutting off the electrode, a distributed inductor 379 (FIG. 41(a)) is cut off at an electrode portion 380. As a result, the values of a distributed capacitance 381 and the distributed inductance 379 can be varied as desired.

Figure 41B:
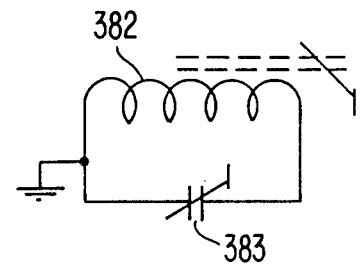

FIG. 41(b) illustrates the tuning circuit in the form of a lumped-constant equivalent circuit which comprises a parallel-connected circuit of a variable inductor 382 and a variable capacitor 383.

Figure 42:
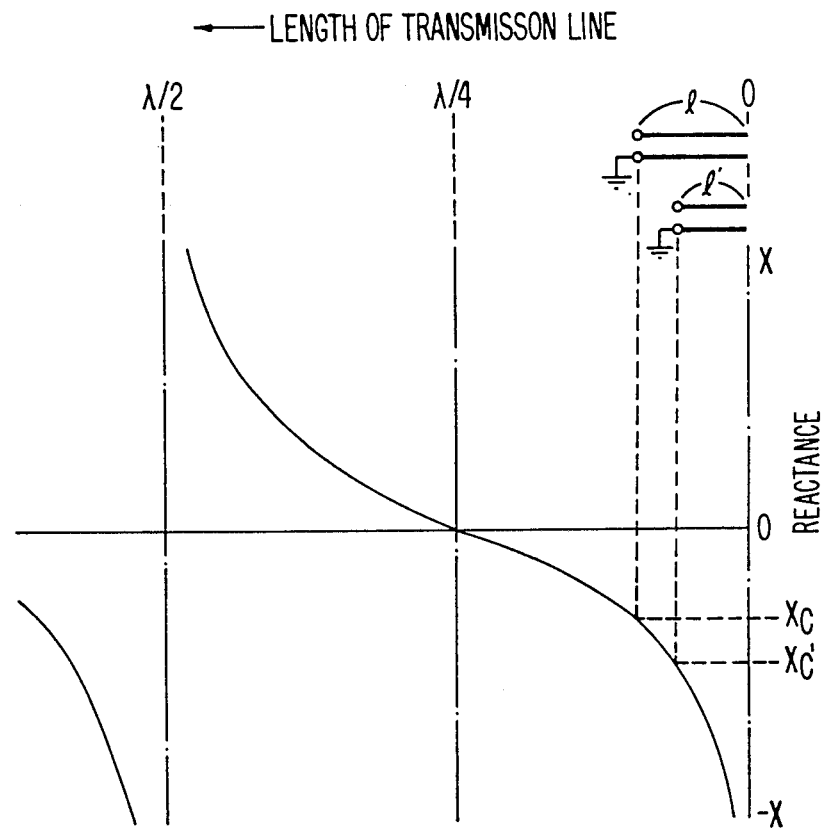
FIG. 42 is a diagram showing the relationship between the length of a transmission line and the reactance.

The inductance of the inductor of the tuning circuit can be designed as desired by the number of turns of the spiral electrodes or the length of the spiral electrodes. The capacitance of the distributed capacitor can be designed as desired by the area in which the spiral electrodes confront each other, the dielectric constant and thickness of the dielectric. The formation of the distributed capacitance will be described further with reference to FIG. 42. The confronting spiral electrodes has a transmission-line equivalent length l which is designed to be shorter than $\lambda/4$ at an operating frequency taking into account a wavelength shortening coefficient $1\sqrt{\epsilon}$ determined by the dielectric constant $\epsilon$ of the dielectric used. By selecting the ratio of the transmission-line equivalent length l to the $\lambda/4$ as desired, the value of a capacitive reactance Xc can be designed as desired. A capacitance $C = \frac{1}{2}\pi f_o X_c$ can be determined from the capacitive reactance Xc and the operating frequency $f_o$.

If the transmission-line equivalent length l is shortened to a transmission-line equivalent length l', the capacitive reactance Xc is changed to a capacitive reactance Xc'. A capacitance $C' = \frac{1}{2}\pi f_o X_c'$ can be determined from the capacitive reactance Xc' and the operating frequency $f_o$. The capacitance is thus varied since $C' < C$. The capacitor having the capacitance C is equivalent to the variable capacitor 108 shown in FIG. 41(b). The length of the spiral electrode (the spiral electrode 377 in FIG. 40(c)) forming the capacitor electrode which is grounded has been illustrated as being the same as the length of the spiral electrode (the spiral electrode 376 in FIG. 40(a)) forming the inductor electrode. However, the capacitor electrode may be of any desired length shorter than the inductor electrode, and may be formed at any desired position confronting the inductor electrode.

FIGS. 43, 44, 45 and 46 are illustrative of the manner in which the variable capacitor and the variable inductor of the tuning circuit of FIGS. 40(a) through 40(c), as an example, are variably adjusted.

Figure 43:
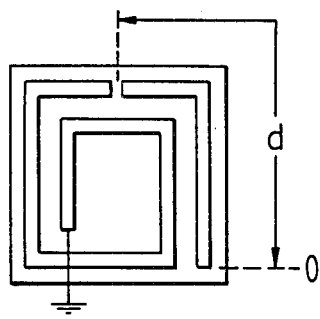
FIGS. 43 through 46 are illustrative of modes of variable adjustment of a variable capacitor and a variable inductor of tuning circuits.
Figure 44:
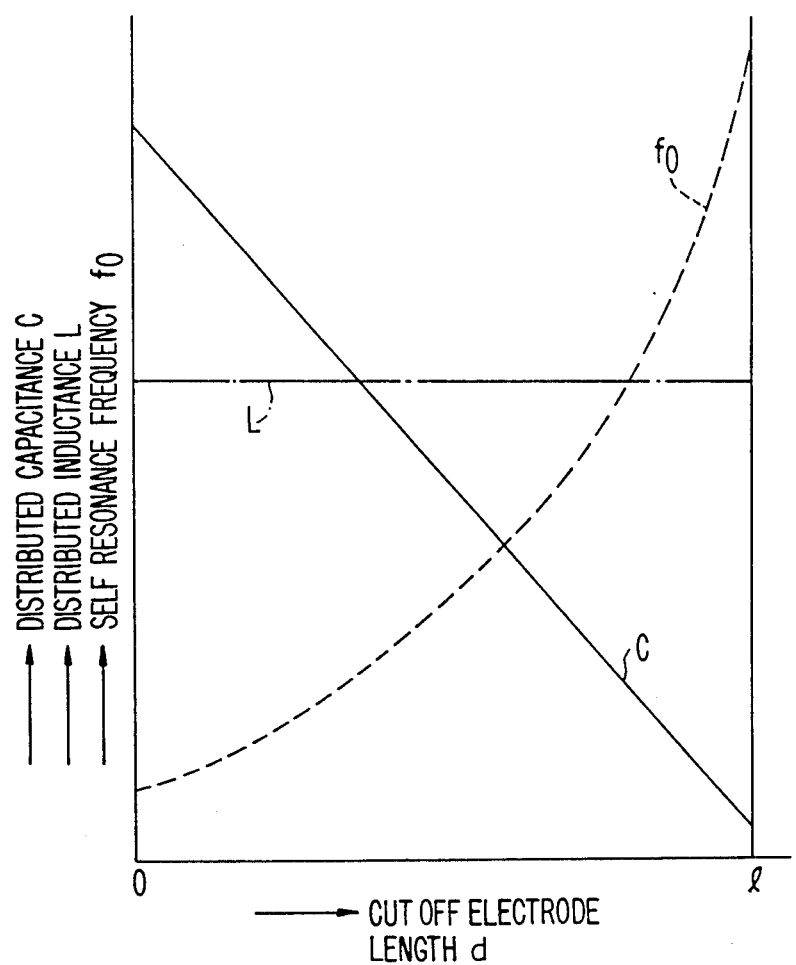
Figure 45:
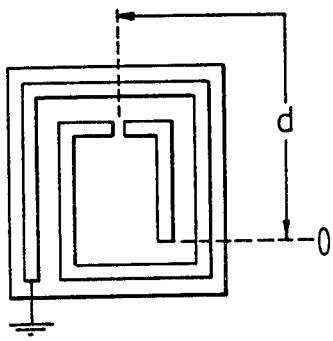
Figure 46:
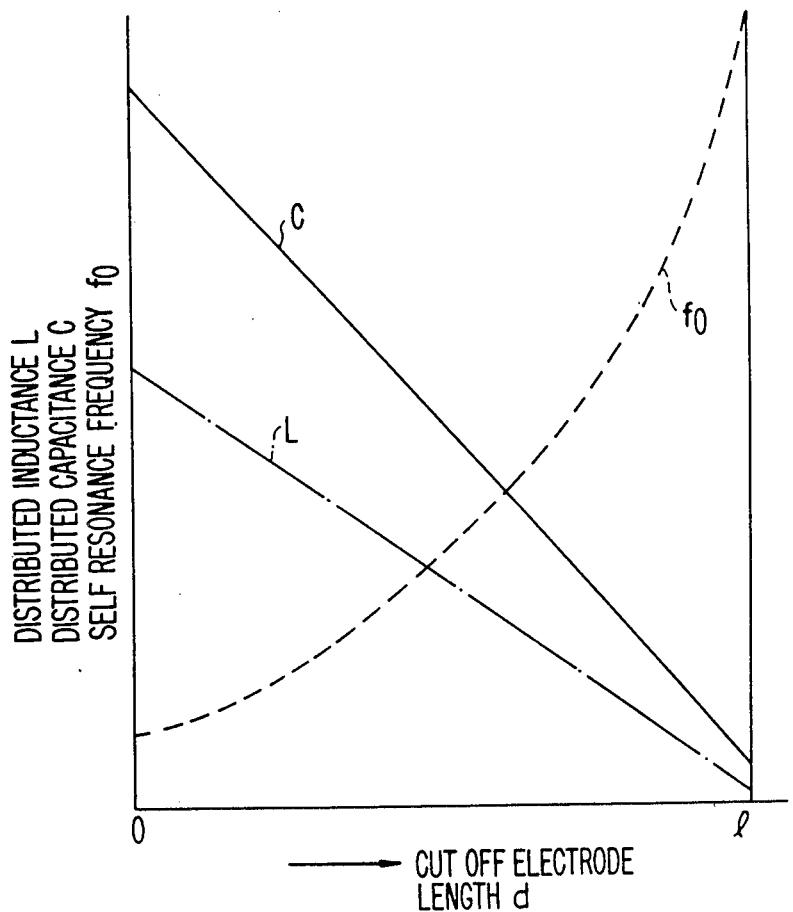

FIGS. 43 and 44 are explanatory of a mode for adjusting the variable capacitor by cutting off the capacitor electrode. FIG. 44 shows the relationship between an electrode length d from the open terminal to the cut-off position, a distributed capacitance C over the electrode length d, a distributed inductance L over the electrode length d, and a self-resonant frequency $f_o$ for the electrode length d. As the electrode length d increases, the distributed capacitance C is reduced but the distributed inductance L remains unchanged, and the self-resonant frequency $f_o$ goes higher. FIGS. 45 and 46 are explanatory of a mode for simultaneously adjusting the variable inductor and the variable capacitor by cutting off the inductor electrode. FIG. 46 shows the relationship between an electrode length d from the open terminal to the cut-off position, a distributed capacitance C over the electrode length d, a distributed inductance L over the electrode length d, and a self-resonant frequency fo for the electrode length d. As the electrode length d increases, both the distributed inductance L and the distributed capacitance C are reduced, and the self-resonant frequency $f_o$ goes higher.

The electrode may be cut off by non-contant cutter means such as a laser cutter or a sand blaster which does not affect the tuning frequency during cutting operation.

With the above embodiment, the inductor electrode and the capacitor electrode are shared by each other and the inductance of the capacitor electrode which is grounded is cancelled out, so that the variable inductor and the variable capacitor are of an integral construction.

Figure 47:
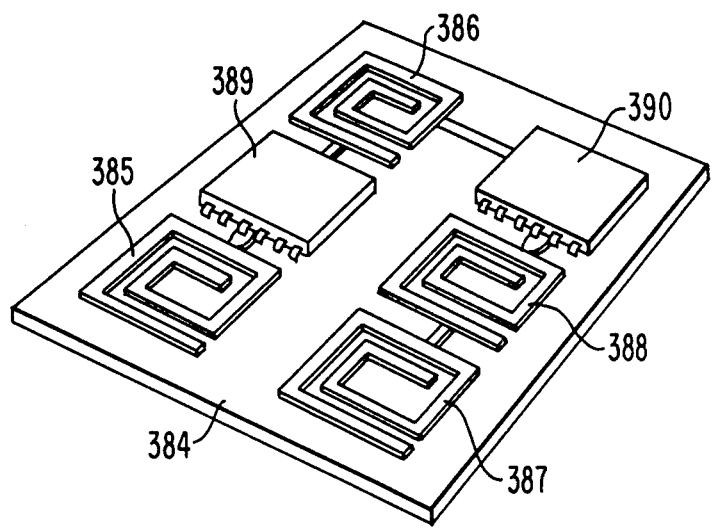
FIG. 47 is a perspective view of a tuning system according to an embodiment of the present invention.

FIG. 47 shows a tuning system according to an embodiment of the present invention, representing the tuning circuits for adjusting tuning frequencies as described with reference to FIGS. 32(a) through 32(c), 40(a) through 40(c), and 46. Tuning circuits 385, 386, 387 and 388 are scattered on a single-layer or multilayer circuit board or substrate 384 (the electrodes on the reverse side and intermediate electroes are not shown). The tuning circuits 385 and 386 are connected to each other by another circuit element 389, and the tuning circuits 387 and 388 are directly connected to each other. The tuning circuits 386 and 388 are connected to each other by another circuit element 390. The circuit elements 389 and 390 may comprise amplifiers, oscillators, mixers, modulators, demodulators, or detectors. The tuning circuits 385, 386, 387 and 388 and the other circuit elements 389 and 390 may be positioned at any desired locations on the circuit substrate 384, and as many tuning circuits and other circuit elements as desired may be mounted. The tuning frequencies of the tuning circuits 385 through 388 can independently be adjusted. The electrodes in the tuning circuits 385 through 388 may be formed of metal conductors or printed conductors, and mutually confronting electrodes may be formed of different conductors. The electrodes may be disposed within the circuit substrate, rather than on its surfaces, or may be disposed on an intermediate layer of a multilayer circuit substrate. The circuit substrate 384 may be made of alumina ceramic, plastics, Teflon (trademark), glass, or mica, for example. The tuning circuits 385 through 388 which are in the form of metal conductors can be bonded simultaneously to the circuit substrate 384. The tuning circuits 385 through 388 which are in the form of printed conductors can be printed simultaneously on the circuit substrate 384 at the time other circuit patterns are formed thereon. It is possible to connect other variable reactance elements (not shown) to the tuning circuits 385 through 388 so that the tuning frequencies of the tuning circuits 385 through 388 will be varied in a ganged relationship.

With the present invention, as described above, each tuning circuit is composed of a variable inductor electrode doubling as a variable capacitor electrode, and a variable capacitor electrode, the variable inductor and capacitor electrodes being disposed in adjacent and confronting relation with a common dielectric circuit substrate interposed therebetween, and other circuit elements are formed on the dielectric circuit substrate and connected to the tuning circuits. The tuning frequency of each tuning circuit can be selected as desired by cutting off an electrode or adjusting the position of a ground terminal connected to the electrode.

The tuning circuit of the present invention has the following advantages:

(1) The variable inductor and the variable capacitor may be integrally formed in the circuit substrate.

(2) The tuning circuit is of an extremely low profile and an extremely small size, and a tuning system which is of a low profile and a small size that have not been achieved heretofore can be realized by employing other circuit elements which are also of a low profile and a small size.

(3) Since the adjusted tuning circuit has no mechanically moving parts, the tuning circuit is subjected to only extremely small tuning fequency shifts.

(4) Since the variable inductor and the variable capacitor are interconnected without leads, the circuit operation of the tuning circuit is highly stable without being affected by any lead inductance and stray capacitance.

(5) Because the electrodes of the tuning circuit can be fabricated together with other circuit elements, the number of parts used can be reduced, and the manufacturing process is improved, with the result that the cost of manufacture can be lowered.

(6) Where the electrodes are cut off for adjusting the tuning frequency of the tuning circuit, a noncontacting frequency adjusting means may be employed, so that the tuning circuit can be adjusted without affecting the tuning frequency.

(7) Where the position of the ground terminal is adjusted for adjusting the tuning frequency, a nondestructive electrode adjusting means may be employed, so that the tuning frequency can repeatedly be increased or lowered.

(8) The speed of trimming the tuning frequency of the tuning circuit is increased.

The initial setting values of the variable inductance and the variable capacitance in the tuning circuit are dependent on a simple artwork for an electrode pattern, so that the tuning circuit can be designed with increased freedom and the constants can easily be corrected.

The electrode conductors of the tuning circuit may partially be formed in an intermediate layer of a multilayer circuit substrate, with the result that the packaging of the tuning circuit can be designed with more freedom.

What is claimed is:

1. A tuning system comprising:
a dielectric;
a pair of first and second electrodes confronting each other with said dielectric interposed therebetween, each of said first and second electrodes having at least one bent portion to present primarily a lumped-constant inductance and having a desired equivalent electrical length;
said first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric;
one of said first and second electrodes having a first terminal at a desired position thereof, the electrodes forming a two-terminal circuit network having the first terminal with the ground or common terminals serving as a second terminal, the two-terminal circuit network forming an equivalent parallel resonant circuit composed of a lumped-constant inductance formed by said one electrode and a parasitic distributed-constant capacitance between the first and second electrodes; and
a feedback amplifier connected at its feedback terminal to said first terminal of said equivalent parallel resonant circuit for generating an inherent voltage vibration to produce a tuning oscillating signal.

2. The tuning system according to claim 1, wherein each of said electrodes has a spiral shape.

3. The tuning system according to claim 1, wherein each of said electrodes has a zigzag shape.

4. The tuning system according to claim 1, wherein said dielectric is in the form of a hollow cylinder.

5. The tuning system according to claim 1, wherein said dielectric is in a tubular form.

6. The tuning system according to claim 1, wherein said dielectric is in the form of a plate.

7. The tuning system according to claim 1, wherein at least one of said electrodes has a portion cut off for adjusting the oscillation tuning frequency.

8. The tuning system according to claim 1, wherein one of said electrodes has the ground or common terminal at the center thereof, and the other of said electrodes has the ground or common terminals at both ends thereof.

9. The tuning system according to claim 1, further comprising a reactance element connected between said first terminal and said ground or common terminal.

10. A tuning system comprising:
a dielectric;
a pair of first and second electrodes confronting each other with said dielectric interposed therebetween, each of said first and second electrodes having at least one bent portion to present primarily a lumped-constant inductance and having a desired equivalent electrical length;
said first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric;
one of said first and second electrodes having a first terminal at a desired position thereof, the electrodes forming a two-terminal circuit network having the first terminal with the ground or common terminals serving as a second terminal, the two-terminal circuit network forming an equivalent parallel resonant circuit composed of a lumped-constant inductance formed by said one electrode and a parasitic distributed-constant capacitance between the first and second electrodes; and
an amplifier connected at its output terminal to said first terminal of said equivalent parallel resonant circuit for generating a tuning amplifying action to produce a selective tuning amplified signal.

11. The tuning system according to claim 10, wherein each of said electrodes has a spiral shape.

12. The tuning system according to claim 10, wherein each of said electrodes has a zigzag shape.

13. The tuning system according to claim 10, wherein said dielectric is in the form of a hollow cylinder.

14. The tuning system according to claim 10, wherein said dielectric is in a tubular form.

15. The tuning system according to claim 10, wherein said dielectric is in the form of a plate.

16. The tuning system according to claim 10, wherein at least one of said electrodes has a portion cut off for adjusting the amplifying frequency.

17. The tuning system according to claim 10, wherein one of said electrodes has the ground or common terminal at the center thereof, and the other of said electrodes has the ground or common terminals at both ends thereof.

18. The tuning system according to claim 10, further comprising a reactance element connected between said first terminal and said ground or common terminal.

19. A tuning system comprising:
   a dielectric;
   a pair of first and second electrodes confronting each other with said dielectric interposed therebetween, each of said first and second electrodes having at least one bent portion to present primarily a lumped-constant inductance and having a desired equivalent electrical length;
   said first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric;
   one of said first and second electrodes having a first terminal at a desired position thereof, the electrodes forming a two-terminal circuit network having the first terminal with the ground or common terminals serving as a second terminal, the two-terminal circuit network forming an equivalent parallel resonant circuit composed of a lumped-constant inductance formed by said one electrode and a parasitic distributed-constant capacitance between the first and second electrodes; and
   a mixer connected at its mixing output terminal to said first terminal of said equivalent parallel resonant circuit and responsive to frequency signals to be mixed for generating a frequency converting action to produce an intermediate-frequency tuning signal.

20. The tuning system according to claim 19, wherein each of said electrodes has a spiral shape.

21. The tuning system according to claim 19, wherein each of said electrodes has a zigzag shape.

22. The tuning system according to claim 19, wherein said dielectric is in the form of a hollow cylinder.

23. The tuning system according to claim 19, wherein said dielectric is in a tubular form.

24. The tuning system according to claim 19, wherein said dielectric is in the form of a plate.

25. The tuning system according to claim 19, wherein at least one of said electrodes has a portion cut off for adjusting the intermediate tuning frequency.

26. The tuning system according to claim 19, wherein one of said electrodes has the ground or common terminal at the center thereof, and the other of said electrodes has the ground or common terminals at both ends thereof.

27. The tuning system according to claim 19, further comprising a reactance element connected between said first terminal and said ground or common terminal.

28. A superheterodyne tuning system comprising:
   a tuning oscillator circuit for producing a tuning oscillating signal;
   a selective tuning amplifier circuit for amplifying a received signal to obtain a selective tuning amplified signal;
   a mixer circuit for mixing said selective tuning amplified signal and said tuning oscillating signal thereby to obtain an intermediate frequency signal; and
   an equivalent parallel resonant circuit comprising:
   a dielectric; and
   a pair of first and second electrodes confronting each other with said dielectric interposed therebetween, each of said first and second electrodes having at least one bent portion to present primarily a lumped-constant inductance and having a desired equivalent electrical length;
   said first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric;
   one of said first and second electrodes having a first terminal at a desired position thereof, the electrodes forming a two-terminal circuit network having the first terminal with the ground or common terminals serving as a second terminal, the two-terminal circuit network forming said equivalent parallel resonant circuit composed of a lumped-constant inductance formed by said one electrode and a parasitic distributed-constant capacitance between the first and second electrodes;
   wherein at least one of an oscillation output terminal of said tuning oscillator circuit, an amplifying output terminal of said selective tuning amplifier circuit and a mixing output terminal of said mixer circuit is connected to said first terminal of said equivalent parallel resonant circuit.

29. The tuning system according to claim 28, wherein each of said electrodes has a spiral shape.

30. The tuning system according to claim 28, wherein each of said electrodes has a zigzag shape.

31. The tuning system according to claim 28, wherein said dielectric is in the form of a hollow cylinder.

32. The tuning system according to claim 28, wherein said dielectric is in a tubular form.

33. The tuning system according to claim 28, wherein said dielectric is in the form of a plate.

34. The tuning system according to claim 28, wherein at least one of said electrodes has a portion cut off for adjusting the tuning frequency.

35. The tuning system according to claim 28, wherein one of said electrodes has the ground or common terminal at the center thereof, and the other of said electrodes has the ground or common terminals at both ends thereof.

36. The tuning system according to claim 28, further comprising a reactance element connected between said first terminal and said ground or common terminal.

37. The tuning system according to claim 36, wherein said reactance element comprises a voltage-variable capacitance diode.

38. The tuning system according to claim 36, including a phase-locked loop for controlling the oscillation frequency of the tuning oscillator circuit, the arrangement being such that a control bias voltage from said phase-locked loop for said voltage-variable capacitance diode is employed as required as a tuning control voltage for said selective tuning amplifier circuit.

39. A superheterodyne tuning system comprising:
a tuning oscillator circuit for producing a tuning oscillating signal;
a selective tuning amplifier circuit for amplifying a received signal to obtain a selective tuning amplified signal;
a mixer circuit for mixing said selective tuning amplified signal and said tuning oscillating signal thereby to obtain an intermediate frequency signal; and
two or more equivalent parallel circuits each comprising:
a dielectric; and
a pair of first and second electrodes confronting each other with said dielectric interposed therebetween, each of said first and second electrodes having at least one bent portion to present primarily a lumped-constant inductance and having a desired equivalent electrical length;
said first and second electrodes having ground or common terminals located out of mutually confronting positions so that voltage signals induced by mutual induction between the electrodes will be opposite in phase with respect to each other, thereby producing a parasitic distributed-constant capacitance due to a potential difference between the electrodes and a dielectric constant of the dielectric;
one of said first and second electrodes having a first terminal at a desired position thereof, the electrodes forming a two-terminal circuit network having the first terminal with the ground or common terminals serving as a second terminal, the two-terminal circuit network forming each of said equivalent parallel resonant circuits composed of a lumped-constant inductance formed by said one electrode and a parasitic distributed-constant capacitance between the first and second electrodes;
wherein two or more of an oscillation output terminal of said tuning oscillator circuit, an amplifying output terminal of said selective tuning amplifier circuit and a mixing output terminal of said mixer circuit are respectively connected to said two or more equivalent parallel resonant circuits, each through said first terminal, said two or more equivalent parallel resonant circuits sharing a same dielectric body as said dielectric.

40. The tuning system according to claim 39, wherein each of said electrodes has a spiral shape.

41. The tuning system according to claim 39, wherein each of said electrodes has a zigzag shape.

42. The tuning system according to claim 39, wherein said dielectric is in the form of a hollow cylinder.

43. The tuning system according to claim 39, wherein said dielectric is in a tubular form.

44. The tuning system according to claim 39, wherein said dielectric is in the form of a plate.

45. The tuning system according to claim 39, wherein at least one of said electrodes has a portion cut off for adjusting the tuning frequency.

46. The tuning system according to claim 39, wherein one of said electrodes has the ground or common terminal at the center thereof, and the other of said electrodes has the ground or common terminals at both ends thereof.

47. The tuning system according to claim 39, further comprising a reactance element connected between said first terminal and said ground or common terminal.

48. The tuning system according to claim 47, wherein said reactance element comprises a voltage-variable capacitance diode.

49. The tuning system according to claim 48, incluing a phase-locked loop for controlling the oscillation frequency of the tuning oscillator circuit, the arrangement being such that a control bias voltage from said phase-locked loop for said voltage-variable capacitance diode is employed as required as a tuning control voltage for said selective tuning amplifier circuit.

* * * * *